US012567607B2

(12) United States Patent　　　　(10) Patent No.:　US 12,567,607 B2

McBride et al.　　　　　　　　　(45) Date of Patent:　Mar. 3, 2026

(54) LITHIUM-ION BATTERY MANAGEMENT SYSTEM (BMS) HAVING COMPACT HEAT SINKING ARRANGEMENT, LITHIUM-ION BATTERY HAVING BMS WITH COMPACT HEAT SINKING ARRANGEMENT, AND METHOD OF MAKING BMS WITH COMPACT HEAT SINKING ARRANGEMENT

(71) Applicant: The Noco Company, Glenwillow, OH (US)

(72) Inventors: James P. McBride, Phoenix, AZ (US); Matthew Michael Bosway, Queen Creek, AZ (US)

(73) Assignee: The Noco Company, Glenwillow, OH (US)

( * ) Notice: Subject to any disclaimer, the term of this patent is extended or adjusted under 35 U.S.C. 154(b) by 439 days.

(21) Appl. No.: 18/178,751

(22) Filed: Mar. 6, 2023

(65) Prior Publication Data

US 2023/0207900 A1　　Jun. 29, 2023

Related U.S. Application Data

(63) Continuation-in-part of application No. 17/594,584, filed as application No. PCT/US2020/029825 on Apr.
(Continued)

(51) Int. Cl.
H01M 10/42　　　(2006.01)
H01M 50/519　　(2021.01)
(Continued)

(52) U.S. Cl.
CPC ....... H01M 10/425 (2013.01); H01M 50/519 (2021.01); H05K 1/0203 (2013.01);
(Continued)

(58) Field of Classification Search
CPC ........... H01M 10/0525; H01M 10/425; H01M 2010/4271; H01M 50/519; H05K 1/0203;
(Continued)

(56) References Cited

U.S. PATENT DOCUMENTS

| D327,883 S | 7/1992 | Gloton |
|---|---|---|
| D328,599 S | 8/1992 | Gloton |

(Continued)

FOREIGN PATENT DOCUMENTS

| CN | 106849287 | 6/2017 |
|---|---|---|
| CN | 109429529 | 3/2019 |

(Continued)

OTHER PUBLICATIONS

IP Australia, Appl. 2023200163, Examination Report No. 1, Dec. 5, 2023.
(Continued)

*Primary Examiner* — Victoria H Lynch
(74) *Attorney, Agent, or Firm* — Jones Day

(57)　　　　　　ABSTRACT

A battery management system (BMS) having a printed circuit board (PCB) with a diagonal arrangement for use in a Li-ion battery, a Li-ion battery having a battery management system (BMS) having a printed circuit board (PCB) with a diagonal arrangement, and a BMS having a printed circuit board with diagonal arrangement method.

47 Claims, 15 Drawing Sheets

Related U.S. Application Data 24, 2020, now Pat. No. 12,040,457, which is a continuation-in-part of application No. 16/564,758, filed on Sep. 9, 2019, now Pat. No. 11,251,507.

(60) Provisional application No. 62/892,785, filed on Aug. 28, 2019, provisional application No. 62/839,348, filed on Apr. 26, 2019.

(51) Int. Cl.

| | |
|---|---|
| *H05K 1/02* | (2006.01) |
| *H05K 1/182* | (2026.01) |
| *H01M 10/0525* | (2010.01) |

(52) U.S. Cl.
CPC ......... *H05K 1/182* (2013.01); *H01M 10/0525* (2013.01); *H01M 2010/4271* (2013.01); *H05K 2201/066* (2013.01); *H05K 2201/10166* (2013.01)

(58) Field of Classification Search
CPC ...... H05K 1/0265; H05K 1/111; H05K 1/182; H05K 2201/066; H05K 2201/10151; H05K 2201/10166; Y02E 60/10
See application file for complete search history.

(56) References Cited

U.S. PATENT DOCUMENTS

| | | |
|---|---|---|
| D459,706 S | 7/2002 | Ebihara et al. |
| D466,093 S | 11/2002 | Ebihara et al. |
| D471,167 S | 3/2003 | Ebihara et al. |
| D471,524 S | 3/2003 | Ebihara et al. |
| D547,371 S | 7/2007 | Miller |
| D552,098 S | 10/2007 | Nishizawa et al. |
| D637,193 S | 5/2011 | Andre et al. |
| D639,756 S | 6/2011 | Greene, Jr. |
| D642,546 S | 8/2011 | Greene, Jr. |
| D669,478 S | 10/2012 | Lepp et al. |
| D669,479 S | 10/2012 | Lepp et al. |
| D673,921 S | 1/2013 | Ozawa |
| D673,922 S | 1/2013 | Moriai et al. |
| D690,672 S | 10/2013 | Yoshida et al. |
| D734,756 S | 7/2015 | Stone et al. |
| D735,203 S | 7/2015 | Kim et al. |
| D735,204 S | 7/2015 | Kim et al. |
| D736,212 S | 8/2015 | Kang et al. |
| D736,213 S | 8/2015 | Kang et al. |
| D736,216 S | 8/2015 | Kang et al. |
| D739,856 S | 9/2015 | Kang et al. |
| D757,015 S | 5/2016 | Amit et al. |
| D759,022 S | 6/2016 | Beals et al. |
| D772,232 S | 11/2016 | Cho |
| D783,621 S | 4/2017 | Lee et al. |
| D813,182 S | 3/2018 | Imai et al. |
| D814,473 S | 4/2018 | Kadonaga |
| D837,171 S | 1/2019 | Vasoya et al. |
| D848,432 S | 5/2019 | Lim et al. |
| D856,948 S | 8/2019 | Vasoya et al. |
| D864,968 S | 10/2019 | Beals |
| D869,469 S | 12/2019 | Lim |
| D869,470 S | 12/2019 | Lim |
| D872,032 S | 1/2020 | Morelli et al. |
| D872,033 S | 1/2020 | Morelli et al. |
| D893,439 S | 8/2020 | Vasoya et al. |
| D902,164 S | 11/2020 | Kondo et al. |
| D909,319 S | 2/2021 | Nordeen |
| D930,601 S | 9/2021 | McBride et al. |
| D937,792 S | 12/2021 | McBride et al. |
| D937,793 S | 12/2021 | McBride et al. |
| D938,374 S | 12/2021 | McBride et al. |
| D944,219 S | 2/2022 | McBride et al. |
| D949,117 S | 4/2022 | McBride et al. |
| D958,762 S | 7/2022 | McBride et al. |
| 2001/0007727 A1 | 7/2001 | Bolstad et al. |
| 2003/0081387 A1 | 5/2003 | Schulz |
| 2006/0097374 A1 | 5/2006 | Egawa |
| 2007/0222417 A1 | 9/2007 | Kim et al. |
| 2009/0268390 A1 | 10/2009 | King et al. |
| 2010/0171462 A1 | 7/2010 | Yang |
| 2010/0330404 A1 | 12/2010 | Nishino et al. |
| 2012/0082875 A1 | 4/2012 | Watanabe et al. |
| 2012/0308849 A1 | 12/2012 | Tortstensson et al. |
| 2014/0014969 A1 | 1/2014 | Kunii et al. |
| 2014/0079959 A1 | 3/2014 | Nicoson |
| 2014/0233189 A1 | 8/2014 | Shin |
| 2014/0285990 A1 | 9/2014 | Kim et al. |
| 2015/0118523 A1 | 4/2015 | Shrader et al. |
| 2015/0279760 A1 | 10/2015 | Miyawaki |
| 2017/0345800 A1 | 11/2017 | Kobayakawa |
| 2018/0241285 A1* | 8/2018 | Sasaki .................. H05K 1/0204 |
| 2018/0281608 A1 | 10/2018 | Albanna et al. |
| 2018/0345803 A1 | 12/2018 | Nook et al. |
| 2018/0366567 A1 | 12/2018 | Morinaga et al. |
| 2019/0310321 A1 | 10/2019 | Mi et al. |
| 2022/0209307 A1 | 6/2022 | McBride et al. |

FOREIGN PATENT DOCUMENTS

| | | |
|---|---|---|
| JP | 2003-217680 | 7/2003 |
| JP | 2006-173167 | 6/2006 |
| JP | 2006-196398 | 7/2006 |
| JP | 2013-183539 | 9/2013 |
| JP | 2014-017444 | 1/2014 |
| JP | 2015-191939 | 11/2015 |
| JP | 2015-204968 | 11/2015 |
| JP | 2016-170034 | 9/2016 |
| JP | 2016-178629 | 10/2016 |
| JP | 2018-174045 | 11/2018 |
| WO | WO 2011/096863 | 8/2011 |
| WO | WO 2011/054353 | 4/2014 |
| WO | WO 2018/235137 | 12/2018 |

OTHER PUBLICATIONS

UK Intellectual Property Office, Appl. GB2312131.2, Combined Search and Examination Report, Oct. 11, 2023.
Japan Patent Office, Appl. 2023-109080, Office Action, Feb. 12, 2025.
CNIPA, Appl. 202080033424.1, Second Office Action, Mar. 14, 2025.
Canadian IP Office, Appl. 3,137,957, Examiner Requisition, Sep. 24, 2024.
IP Australia, Appl. 2024201886, Examination Report No. 1, Dec. 13, 2024.
Japan Patent Office, Appl. 2023-109080, Office Action, Sep. 30, 2024.
Mexican Patent Office, Appl. MX/a/2021/013039, Office Action, Sep. 2, 2024.
CNIPA, Appl. 202080033424.1, First Office Action, Jul. 26, 2024.
Canadian IP Office, Appl. 3,137,957, Examiner Requisition, Dec. 12, 2022.
Japan Patent Office, Appl. 2021-563366, Office Action, Jan. 17, 2023.
Indian Patent Application No. 202137052345, Examination Report, dated May 31, 2022.
Patent Cooperation Treaty, PCT/US2020/029825, International Search Report and Written Opinion of the International Searching Authority, dated Jul. 23, 2020.
UK Intellectual Property Office, Appl. GB2117046.9, Examination Report, Nov. 9, 2022.
Patent Cooperation Treaty, PCT/US2023/065662, International Search Report and Written Opinion of the International Searching Authority, dated Oct. 13, 2023.
Parthasarathy, et al., "An Overview of Battery Charging Methods, Charge Controllers, and Design of MPPT Controller based on Adruino Nano for Solar Renewable Storage Energy System," International Journal of Engineering Research & Technology, 9(11):430-439; Nov. 2020.

(56) References Cited

OTHER PUBLICATIONS

European Patent Office, Appl. 20796165.7, Extended European Search Report, May 3, 2023.

CNIPA, Appl. 202080033424.1, Third Office Action, Aug. 22, 2025.

Patent Cooperation Treaty, PCT/US2023/065662, International Preliminary Report on Patentability, dated Sep. 9, 2025.

CNIPA, Appl. 202080033424.1, Rejection Decision, Nov. 13, 2025.

* cited by examiner

LITHIUM-ION BATTERY MANAGEMENT SYSTEM (BMS) HAVING COMPACT HEAT SINKING ARRANGEMENT, LITHIUM-ION BATTERY HAVING BMS WITH COMPACT HEAT SINKING ARRANGEMENT, AND METHOD OF MAKING BMS WITH COMPACT HEAT SINKING ARRANGEMENT

CROSS-REFERENCE TO RELATED APPLICATIONS

This application is a continuation-in-part of U.S. patent application Ser. No. 17/594,584, filed on Oct. 22, 2021, which is a national stage entry of International Patent Application No. PCT/US2020/029825, filed on Apr. 24, 2020, which claims priority from U.S. Provisional Application No. 62/839,348, filed on Apr. 26, 2019, and also from U.S. Provisional Application No. 62/892,785, filed on Aug. 28, 2019; International Patent Application No. PCT/US2020/029825 is also a continuation-in-part of U.S. patent application Ser. No. 16/564,758, filed on Sep. 9, 2019; the contents of each of which are incorporated herein by reference in their entirety.

FIELD

The present disclosure relates to a lithium-ion (Li-ion) Battery Management System (BMS) with a diagonal arrangement, a Li-ion battery having BMS with a diagonal arrangement, and a method of making a BMS with a diagonal arrangement.

The diagonal arrangement provides orienting electronic components, for example, PCB components (e.g. conductive plates, fills, and/or traces), MOSFETs, and/or current sense resistors in a diagonal structure or arrangement to provide a compact structure and arrangement and/or a diagonal heating sinking structure and arrangement to maximize heat sinking capability of the PCB of the BMS.

BACKGROUND

Lithium ion batteries differ from other battery technologies in that they require a Battery Management System (BMS) in order to provide protection. The BMS is typically integrated into the battery and is designed to disconnect the internal battery cells from the external battery terminals in case of over-charge, over-discharge, over-current, short-circuit, and over-temperature.

Since the BMS is arranged in series with the battery cells, the electronic components in the BMS must accommodate the full battery current. In some cases, for example, a vehicle starter battery, this can be a very high current which generates a significant temperature rise. Managing the temperature of the electronic components in the BMS can be challenging due to limited space and cost constraints.

BMS switching is typically performed with MOSFETs. The solution to the difficult problem of managing temperature rise in the MOSFETs has typically been handled in two ways. The first is using surface mount MOSFETs soldered to a Printed Circuit Board (PCB) using copper traces and pads on the PCB for heat sinking. This method is limited in its effectiveness due to the limited thickness of the copper traces and pads that can be fabricated on a PCB in a cost effective manner. The second method is using either surface mount or through-hole MOSFETs with an external heatsink attached using standard methods such as mechanical fasteners and thermal grease. This method is limited in its effectiveness due to the thermal resistance of the connections.

In addition to MOSFETs, the BMS may contain current sense resistors and other power electronic components that have the same thermal challenges as MOSFETs.

In order to carry large currents, a typical BMS uses multiple MOSFETs and/or other electronic components such as current sense resistors arranged in parallel to handle the large battery current. Ideally, each MOSFET or current sense resistor shares an equal portion of the battery current and dissipates a portion of the power resulting temperature rise.

The effectiveness of the heat sinking directly affects the number of MOSFETs required. Adding additional MOSFETs to the BMS to decrease temperature rise increases cost and takes up limited space inside the Li-ion battery.

Therefore a need exists for providing an improved BMS for a Li-ion battery, and adequate thermal management in the Li-ion battery BMS in a cost and space effective manner.

Further, the BMS MOSFETs and current sense resistors may be connected in series with the positive battery terminal or the negative battery terminal. In either case, the components connect between a battery terminal, and the battery cells.

In batteries having smaller physical sizes, it can be a challenge to fit the components on the PCB of the BMS with the required amount of heatsinking, and arrange them such that they share equal portions of the current. If the BMS components do not share current equally, the result can be failure.

The typical method of arranging a PCB of a BMS is to line up the MOSFETs and current sense resistors linearly across the length of the PCB of the BMS. However, often the components will not fit on the PCB of the BMS in a manner to achieve the required amount of heatsinking. One solution is to reduce the heatsinking which is undesirable because it increases the temperature of the electronic components and may lead to failure. Another solution is to re-arrange the electronic components to fit in the allowed space. However, this can lead to unequal current sharing and component failure.

Thus, there exists a need to arrange parallel BMS components to fit in a small space and provide equal current sharing. This can be achieved with a diagonal structure and arrangement of the electronic components and/or diagonal heating sinking arrangement.

SUMMARY

The present disclosure is directed to and improved BMS with a diagonal structure and arrangement, an improved lithium ion battery having an improved BMS with a diagonal structure and arrangement, and a method of making a BMS diagonal arrangement.

The diagonal arrangement provides orienting one or more electronic components, for example BMS components (e.g. PCB conductive plates, fills, and/or traces), MOSFETs, and/or current sense resistors in a diagonal structure or arrangement to provide a compact structure or arrangement and/or a diagonal heating sinking structure or arrangement to provide improved heat sinking capability. For example, the MOSFETs and/or current sense resistors are structured and arranged in a diagonal orientation in the BMS (e.g. diagonal orientation on PCB) and/or the PCB conductive plates, fills, and/or traces (e.g. copper plates, copper fills, and/or copper traces) structured and arranged in a diagonal orientation.

The present disclosure involves orienting the BMS MOS-FETs and current sense resistors on a diagonal on the printed circuit board (PCB). This orientation allows the BMS to fit into a space constrained application while maintaining good current sharing between electronic components of the BMS.

The improved BMS can be used with a lithium ion battery (e.g. LCO (Lithium Cobalt Oxide), LTO (Lithium Titanate Oxide), LFP (Lithium Iron Phosphate), LMO (Lithium Manganese Oxide), NMC (Lithium Nickel Manganese Cobalt), and other suitable lithium ion batteries), and the improved lithium ion battery can be any of the above types of lithium ion batteries with the improved BMS with heat sinking.

The PCB of the improved BMS can be provided with multiple electronic components (e.g. MOSFETs and/or current sense resistors) oriented diagonally on one or both sides of the PCB to provide a more compact arrangement. Alternatively, or in addition, the PCB of the improved BMS can be provided with multiple diagonally oriented conductive plates, fills, and/or traces (e.g. multiple diagonal conductive plates arranged parallel relative to each other on the PCB).

The improved BMS with heat sinking comprises one or more electrically conductive plates (e.g. one or more electrically diagonally oriented conductive plates) attached or connected to the Printed Circuit Board (PCB) of the BMS. The electrically conductive plates are used to mount the electronic components (e.g. electronic components of PCB, MOSFETs, and/or current sense resistors) onto the PCB of the BMS. For example, the electrically conductive metal plates are made of copper, copper alloys, plated copper, aluminum, brass, bronze, tin, nickel, silver, or other suitable metals. Specifically, copper plates are made of Grade 110 copper, Grade 101 copper, Grade 145 copper, and other suitable grades of copper.

The electronic components in the BMS are soldered, for example, to the one or more electrically conductive metal plates. The electrically conductive metal plates are connected or attached to electrically conductive metal pads on the PCB by soldering to secure the electrically conductive metal plates to the PCB. For example, the electrically conductive metal plates are soldered at or along edge(s), corner(s), and/or lower surface(s) in order to provide electrical connection to the BMS control electronics. For example, the electrically conductive metal plates can be soldered underneath using solder paste and reflow soldering techniques. Mechanical fasteners may also be used as required to provide additional mechanical strength to withstand vibration and shock. The electrically conductive metal pads, for example, can be 1 oz (ounce) or 2 oz (ounce) copper, but can be thicker or thinner depending on a particular design or application. Copper thickness on the PCB is specified in weight (i.e. the thickness of the electrically conductive metal pads is defined at the weight of copper in ounces that can cover one (1) square foot of the PCB area). The electrically conductive metal pads can comprise a single metal layer or multiple metal layers. In some case the BMS PCB can duplicate the PCB electrically conductive metal pads in multiple layers on the PCB, and connect these layers with multiple vias. A via is a drilled and plated hole between layers. The vias provide electrical and thermal conductivity between layers. This provides additional heat spreading and heat sinking to improve thermal performance. Further, the electrically conductive metal pads can be provided with one or more layers of metal plates located between the electrically conductive metal pads and electrically conductive metal plates to enhance heat sinking. The electrically conductive metal pads can be connected (e.g. via traces) to one or more components and/or circuits on the PCB of the BMS, or can be electrically isolated on the PCB The electrically conductive metal plates are sized as required to allow sufficient room to solder the electronic components, and to maintain the temperature rise of the electronic components of the BMS within their specified operating limits.

The electrically conductive metal plates are located as required to fit inside the battery, and to provide for equal current sharing between parallel electronic components. For example, the electrically conductive metal plates may be $\frac{1}{16}$ or $\frac{1}{8}$ inch thick, or may be thicker or thinner depending on the thermal requirements of the BMS. Further, the electrically conductive metal plates can have a specific shape (e.g. rectangle, square, L-shaped, triangle, round, arc, symbol).

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein two or more of the BMS electronic components bridge the same gap between the electrically conductive metal plates.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the one or more electrically conductive metal pads etched from a continuous copper sheet laminated onto the PCB substrate (e.g. FR4).

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the one or more electrically conductive metal pads are located on the PCB so that corners of the two or more electrically conductive metal plates connect with the one or more electrically conductive metal pads to secure the two or more electrically conductive metal plates to the PCB.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, and wherein multiple MOSFETs are connected between the two or more electrically conductive metal plates.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, and wherein multiple MOSFETs are connected between the two or more electrically conductive metal plates, wherein additional multiple MOSFETs are connected between another two or more electrically conductive metal plates.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein multiple current sense resistors are connected between the two or more electrically conductive metal plates The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, and wherein multiple MOSFETs are connected between the two or more electrically conductive metal plates, wherein multiple current sense resistors are connected between another two or more electrically conductive metal plates.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, wherein one or more current sense resistors are connected between the third electrically conductive metal plate and the fourth electrically conductive metal plate, and wherein multiple MOSFETs are connected between the first electrically conductive metal plate and the second electrically conductive metal plate, wherein multiple MOSFETs are connected between the second electrically conductive metal plate and the third electrically conductive metal plate, and wherein multiple current sense resistors are connected between the third electrically conductive metal plate and the fourth electrically conductive metal plate.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate, further comprising a negative battery terminal connected to the first electrically conductive metal plate.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate, further comprising a negative battery terminal connected to the first electrically conductive metal plate, and, further comprising a positive battery terminal connected to the PCB.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate, further comprising a negative battery terminal connected to the first electrically conductive metal plate, and, further comprising a positive battery terminal connected to the PCB, and further comprising a negative cell terminal connected to the fourth electrically conductive metal plate.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are arranged in electrical series, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate, further comprising a negative battery terminal connected to the first electrically conductive metal plate, and, further comprising a positive battery terminal connected to the PCB, further comprising a negative cell terminal connected to the fourth electrically conductive metal plate, and further comprising a BMS controller is electrically connected to the one or more MOSFETs and the one or more current sense resistors.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are soldered to one or more electrically conductive metal pads for securing the two or more electrically conductive metal plates to the PCB.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the two or more electrically conductive metal plates are made of copper plate.

The presently described subject matter is directed to a battery management system (BMS) with heating sinking, the BMS comprising or consisting of: a printed circuit board (PCB) having one or more electrically conductive metal pads; two or more electrically conductive metal plates each connected to the PCB by the one or more electrically conductive metal pads, the two or more electrically conductive metal plates are located adjacent to and spaced apart from each other on the PCB providing an electrically isolating gap between the two or more electrically conductive metal plates; and one or more electronic components of the BMS are electrically connected between the two or more electrically conductive metal plates, wherein the one or more electrically conductive metal pads are made of copper material.

The presently described subject matter is directed to a method of heat sinking a Battery Maintenance System (BMS), the method comprising: applying one or more electrically conductive metal pads to a printed circuit board (PCB); applying two or more electrically conductive metal plates to the printed circuit board by connecting the two or more electrically conductive metal plates to the one or more electrically conductive metal pads; and connecting one or more electronic components of the BMS between the two or more electrically conductive metal plates.

The presently described subject matter is directed to a method of heat sinking a Battery Maintenance System (BMS), the method comprising: applying one or more electrically conductive metal pads to a printed circuit board (PCB); applying two or more electrically conductive metal plates to the printed circuit board by connecting the two or more electrically conductive metal plates to the one or more electrically conductive metal pads; and connecting one or more electronic components of the BMS between the two or more electrically conductive metal plates, wherein the two or more electrically conductive metal plates are arranged in electrical series.

The presently described subject matter is a Li-ion battery, comprising or consisting of: one or more Li-ion battery cells; and a Battery Management System (BMS) connect in electrical series with the one or more Li-ion battery cells, the BMS comprising: a printed circuit board (PCB) having one or more electrically conductive metal pads; two or more electrically conductive metal plates each connected to the PCB by the one or more electrically conductive metal pads, the two or more conductive metal plates spaced apart from each other on the PCB providing an electrically isolating gap between the two or more electrically conductive metal plates; and one or more electronic components of the BMS connected between the electrically conductive metal plates in a manner to bridge the two or more electrically conductive metal plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates.

The presently described subject matter is directed to a battery management system (BMS) for use in a rechargeable battery, the BMS comprising or consisting of: a printed circuit board (PCB) having two or more electrically conductive metal plates, the two or more electrically conductive metal plates are located adjacent to and spaced apart from each other on the PCB providing an electrically isolating gap between the two or more electrically conductive metal plates; and multiple electronic components of the BMS electrically connected between the two or more electrically conductive metal plates, the multiple electronic components are arranged along at least one diagonally oriented axis of the PCB relative to an edge of the PCB.

The presently described subject matter is directed to a battery management system (BMS) for use in a rechargeable battery, the BMS comprising or consisting of: a printed circuit board (PCB) having two or more electrically conductive metal plates, the two or more electrically conductive metal plates are located adjacent to and spaced apart from each other on the PCB providing an electrically isolating gap between the two or more electrically conductive metal plates, the two or more electrically conductive metal plates each have a diagonally oriented edge along the electrically isolating gab; and multiple electronic components of the BMS electrically connected between the two or more electrically conductive metal plates, the multiple electronic components are arranged along the diagonally oriented axes of the two or more electrically conductive metal plates and bridging the electrically isolating gab between the two or more electrically conductive plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the PCB is provided with multiple electrically conductive metal pads for attaching or anchoring the two or more electrically conductive metal plates to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more electrically conductive metal plates are arranged in electrical series.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein two or more of the BMS electronic components bridge a same gap between the two or more electrically conductive metal plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the multiple electrically conductive metal pads are formed by etching through a metal layer provided on a substrate of the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the multiple conductive metal pads are located on the PCB so that corners of the two or more electrically conductive metal plates connect with the multiple metal pads to secure the two or more electrically conductive metal plates to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein multiple MOSFETs are connected between the two or more electrically conductive metal plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein multiple MOSFETs are connected between the two or more electrically conductive metal plates, and wherein additional multiple MOSFETs are connected between another set of two or more electrically conductive metal plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein multiple current sense resistors are connected between the two or more electrically conductive metal plates The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein two or more of the BMS electronic components bridge a same gap between the two or more electrically conductive metal plates, and wherein multiple current sense resistors are connect between another two or more electrically conductive metal plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more electrically conductive metal plates comprises a first electrically conductive metal plate, a second electrically conductive metal plate, a third electrically conductive metal plate, and a fourth electrically conductive metal plate, and wherein one or more MOSFETs are connected between the first electrically conductive metal plate and the second electrically conductive metal plate, wherein one or more MOSFETs are connected between the second electrically conductive metal plate and the third electrically conductive metal plate, and wherein one or more current sense resistors are connected between the third electrically conductive metal plate and the fourth electrically conductive metal plate, and wherein multiple MOSFETs are connected between the first electrically conductive metal plate and the second electrically conductive metal plate, wherein multiple MOSFETs are connected between the second electrically conductive metal plate and the third electrically conductive metal plate, and wherein multiple current sense resistors are connected between the third electrically conductive metal plate and the fourth electrically conductive metal plate.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, further comprising a negative battery terminal connected to the first electrically conductive metal plate.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, further comprising a negative battery terminal connected to the first electrically conductive metal plate, and further comprising a positive battery terminal connected to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, further comprising a negative battery terminal connected to the first electrically conductive metal plate, further comprising a positive battery terminal connected to the PCB, and further comprising a negative cell terminal connected to the fourth electrically conductive metal plate.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, further comprising a negative battery terminal connected to the first electrically conductive metal plate, further comprising a positive battery terminal connected to the PCB, further comprising a negative cell terminal connected to the fourth electrically conductive metal plate, and further comprising a BMS controller is electrically connected to the one or more MOSFETs and the one or more current sense resistors.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more electrically conductive metal plates are soldered to one or more electrically conductive metal pads of the PCB for securing the two or more electrically conductive metal plates to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more electrically conductive metal plates are made of copper plate.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the one or more electrically conductive metal pads are made of copper material.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the one or more electrically conductive metal pads are located on the PCB so that edges of the two or more electrically conductive metal plates connect with the one or more electrically conductive metal pads to secure the two or more electrically conductive metal plates to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the one or more electrically conductive metal pads are located on the PCB so that the two or more electrically conductive metal plates connect are connected by a lower surface or underneath the two or more electrically conductive metal plates with the one or more electrically conductive metal pads to secure the two or more electrically conductive metal plates to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the one or more electrically conductive metal pads comprise multiple electrically conductive metal layers.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, further comprising multiple conductive metal pads connecting the two or more electrically conductive metal plates to the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein multiple electrically conductive metal pads connect to one or more other electrical components or electrical circuits of the PCB of the BMS.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein multiple electrically conductive metal pads are electrically isolated on the PCB of the BMS and provide only mechanical anchoring of the two or more electrically conductive metal plates.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more diagonally oriented electrically conductive metal plates each have a center axis diagonally oriented relative to edges of the PCB.

The presently described subject matter is directed to a battery management system (BMS) for use in a rechargeable battery, the BMS comprising or consisting of: a printed circuit board (PCB) having two or more diagonally oriented electrically conductive metal plates, the two or more electrically conductive metal plates are located adjacent to and spaced apart from each other on the PCB providing an electrically isolating gap between the two or more electrically conductive metal plates; and one or more electronic components of the BMS electrically connected between the two or more electrically conductive metal plates, wherein the two or more diagonally oriented electrically conductive metal plates each have one or more diagonally oriented edges accommodating the one or more electronic components of the BMS.

The presently described subject matter is directed to a printed circuit board (PCB) for use in a battery management system (BMS) of a rechargeable battery, the PCB comprising: two or more diagonally oriented electrically conductive metal plates connected to the PCB, the two or more electrically conductive metal plates are located adjacent to and spaced apart from each other on the PCB providing an electrically isolating gap between the two or more electrically conductive metal plates.

The presently described subject matter is directed to a printed circuit board (PCB) for use in a battery management system (BMS) of a rechargeable battery, the PCB comprising: two or more electrically conductive metal plates connected to the PCB, the two or more electrically conductive metal plates are located adjacent to and spaced apart from each other on the PCB providing an electrically isolating gap between the two or more electrically conductive metal plates; and multiple electronic components of the BMS electrically connected between the two or more electrically conductive metal plates, the multiple electronic components are arranged along at least one diagonally oriented axis of the PCB relative to an edge of the PCB.

The presently described subject matter is directed to a printed circuit board (PCB) for use in a battery management system (BMS) of a rechargeable battery, the BMS comprising: two or more electrically conductive metal plates connected to the PCB, the two or more electrically conductive metal plates are located adjacent to and spaced apart from each other on the PCB providing an electrically isolating gap between the two or more electrically conductive metal plates, the two or more electrically conductive metal plates each have a diagonally oriented edge along the electrically isolating gab; and multiple electronic components of the BMS electrically connected between the two or more electrically conductive metal plates, the multiple electronic components are arranged along the diagonally oriented axes of the two or more electrically conductive metal plates and bridging the electrically isolating gab between the two or more electrically conductive plates.

The presently described subject matter is directed to a method of making a printed circuit board for use in a battery maintenance system (BMS), the method comprising: applying two or more spaced apart electrically conductive metal plates to a printed circuit board (PCB); and diagonally orienting adjacent and spaced apart respective edges of the two or more electrically conductive metal plates on the PCB.

The presently described subject matter is directed to a method of making a printed circuit board for use in a battery maintenance system (BMS), the method comprising: applying two or more spaced apart electrically conductive metal plates to a printed circuit board (PCB); and diagonally orienting adjacent and spaced apart respective edges of the two or more electrically conductive metal plates on the PCB, further comprising connecting one or more electrical components of the BMS bridging the spaced apart respective edges of the two or more electrically conductive metal plates.

The presently described subject matter is directed to a Li-ion battery, comprising: one or more Li-ion battery cells; and a battery management system (BMS) connect in electrical series with the one or more Li-ion battery cells, the BMS comprising: a printed circuit board (PCB) having two or more spaced apart electrically conductive metal plates, the two or more electrically conductive metal plates having respective diagonally oriented spaced apart edges; and one or more electronic components of the BMS bridging the respective diagonally oriented spaced apart edges.

The presently described subject matter is directed to a battery management system (BMS) for use in a rechargeable battery, the BMS comprising: a printed circuit board (PCB) having two electrically conductive metal plates, the two electrically conductive metal plates being located adjacent to and spaced apart from each other on the PCB providing an electrically isolating gap between the two electrically conductive metal plates; and multiple electronic components of the BMS electrically connected between the two electrically conductive metal plates.

The multiple electronic components of the BMS may include multiple MOSFETs. The BMS may further comprise: a third electrically conductive metal plate located adjacent to and spaced apart from one of the two electrically conductive metal plates on the PCB providing an electrically isolating gap therebetween; and a second set of multiple electronic components electrically connected between the third electrically conductive metal plate and one of the two electrically conductive metal plates. The second set of multiple electronic components may include multiple current sense resistors. The second set of multiple electronic components includes multiple MOSFETs. The BMS may further comprise: a fourth electrically conductive metal plate located adjacent to and spaced apart from the third electrically conductive metal plate on the PCB providing an electrically isolating gap therebetween; and a third set of multiple electronic components electrically connected between the fourth electrically conductive metal plate and third electrically conductive metal plate. The third set of multiple electronic components may include multiple current sense resistors.

The BMS may comprise a first electrically conductive metal plate, a second electrically conductive metal plate, a third electrically conductive metal plate, and a fourth electrically conductive metal plate. Multiple MOSFETs may be connected between the first electrically conductive metal plate and the second electrically conductive metal plate, wherein multiple MOSFETs are connected between the second electrically conductive metal plate and the third electrically conductive metal plate, and wherein multiple current sense resistors are connected between the third electrically conductive metal plate and the fourth electrically conductive metal plate.

The BMS may further comprise a negative battery terminal connected to the fourth electrically conductive metal plate. The BMS may further comprise a positive battery terminal connected to the PCB. The BMS may further comprise a BMS controller electrically connected to the multiple MOSFETs and the multiple current sense resistors. The two electrically conductive metal plates may be arranged in electrical series. The two electrically conductive metal plates may be made of copper. One or more vias may be provided to electrically and thermally connect multiple layers on the PCB.

The BMS may further comprise multiple conductive metal pads connecting the two electrically conductive metal plates to the PCB. The multiple conductive metal pads may be formed by etching through a metal layer provided on a substrate of the PCB. The multiple conductive metal pads may be located on the PCB so that corners of the two electrically conductive metal plates connect with the multiple metal pads to secure the two electrically conductive metal plates to the PCB. Each of the two electrically conductive metal plates may be connected to the PCB using only a single conductive metal pad. Alternatively, the two electrically conductive metal plates may be soldered to the multiple conductive metal pads of the PCB to secure the two electrically conductive metal plates to the PCB. The multiple conductive metal pads may be located on the PCB so that edges of the two electrically conductive metal plates connect with the multiple conductive metal pads to secure the two electrically conductive metal plates to the PCB. The multiple conductive metal pads may be located on the PCB so that the two electrically conductive metal plates are connected by a lower surface underneath the two electrically conductive metal plates to secure the two electrically conductive metal plates to the PCB. The multiple conductive metal pads may be made of copper. The multiple conductive metal pads may comprise a single metal layer. The multiple conductive metal pads may be electrically isolated on the PCB of the BMS and provide only mechanical anchoring of the two electrically conductive metal plates. The multiple conductive metal pads may connect to multiple other electrical components or electrical circuits of the PCB.

The presently described subject matter is directed to a printed circuit board (PCB) for use in a battery management system (BMS) of a rechargeable battery, the PCB comprising: two electrically conductive metal plates, the two electrically conductive metal plates being located adjacent to and spaced apart from each other on the PCB providing an electrically isolating gap between the two electrically conductive metal plates; and multiple electronic components of the BMS electrically connected between the two electrically conductive metal plates.

The presently described subject matter is directed to a method of making a printed circuit board for use in a battery maintenance system (BMS), the method comprising: applying two electrically conductive metal plates to a printed circuit board (PCB), the two electrically conductive metal plates being located adjacent to and spaced apart from each other on the PCB providing an electrically isolating gap between the two electrically conductive metal plates; and connecting multiple electronic components between the two electrically conductive metal plates, thereby bridging the electrically isolating gap between the two electrically conductive metal plates.

The presently described subject matter is directed to a Li-ion battery, comprising: a Li-ion battery cell; and a battery management system (BMS) connected in electrical series with the Li-ion battery cell, the BMS comprising: a printed circuit board (PCB) having two electrically conductive metal plates, the two electrically conductive metal plates being located adjacent to and spaced apart from each other on the PCB providing an electrically isolating gap between the two electrically conductive metal plates; and multiple electronic components of the BMS electrically connected between the two electrically conductive metal plates.

The presently described subject matter is directed to a battery management system (BMS) for use in a rechargeable battery, the BMS comprising: a first electrically conductive metal plate; a second electrically conductive metal plate, the two electrically conductive metal plates being located adjacent to and spaced apart from each other, thereby providing an electrically isolating gap between the two electrically conductive metal plates; and multiple electronic components of the BMS electrically connected between the two electrically conductive metal plates.

The multiple electronic components of the BMS may include multiple MOSFETs. The BMS may further comprise a third electrically conductive metal plate located adjacent to and spaced apart from the first electrically conductive metal plate, thereby providing an electrically isolating gap therebetween; and a second set of multiple electronic components electrically connected between the third and the first electrically conductive metal plates. The second set of multiple electronic components include multiple current sense resistors. The BMS may further comprise a fourth electrically conductive metal plate located adjacent to and spaced apart from the second electrically conductive metal plate, thereby providing an electrically isolating gap therebetween; and a second set of multiple MOSFETs electrically connected between the second and the fourth electrically conductive metal plates. The BMS may further comprise a negative battery terminal connected to the fourth electrically conductive metal plate. The two electrically conductive metal plates may each have one or more diagonally oriented edges accommodating the multiple electronic components.

The BMS may further comprise a BMS controller electrically connected to the multiple electronic components. The BMS may further comprise a printed circuit board (PCB) in electrical communication with the first and the second electrically conductive metal plates, wherein the first and the second electrically conductive metal plates are not positioned as a component on the PCB. The PCB, the first electrically conductive metal plate, and the second electrically conductive metal plate may be arranged within substantially the same plane. The PCB may be affixed to a surface of at least one of the first and the second electrically conductive metal plates. At least one of the first and the second electrically conductive metal plates may have one or more apertures configured to align with one or more apertures on the PCB in a manner that the PCB can be affixed to at least one of the first and the second electrically conductive metal plates. The BMS may further comprise one or more wires providing an electrical communication between the PCB and at least one of the first and the second electrically conductive metal plates.

The presently described subject matter is directed to a Li-ion battery, comprising: a Li-ion battery cells; and a battery management system (BMS) connected in electrical series with the Li-ion battery cell, the BMS comprising: a first electrically conductive metal plate; a second electrically conductive metal plate, the two electrically conductive metal plates being located adjacent to and spaced apart from each other, thereby providing an electrically isolating gap between the two electrically conductive metal plates; and multiple electronic components of the BMS electrically connected between the two electrically conductive metal plates.

The presently described subject matter is directed to a battery management system (BMS) for use in a rechargeable battery, the BMS comprising: a first electrically conductive metal plate; a first set of multiple electronic components positioned along a first edge of the first conductive metal plate, wherein the first set of multiple electronic components are configured to electrically connect the first electrically conductive metal plate to a first module of the BMS; and a second set of multiple electronic components positioned along a second edge of the first conductive metal plate, wherein the second set of multiple electronic components are configured to electrically connect the first electrically conductive metal plate to a second module of the BMS.

The first set of multiple electronic components of the BMS may include multiple MOSFETs. The second set of multiple electronic components may include multiple current sense resistors. The first module may be a second electrically conductive metal plate. The second electrically conductive metal plate may be positioned on a PCB. The second module may be a third electrically conductive metal plate. The first module may be a PCB. The first electrically conductive metal plate, the first module, and the second module may be arranged within substantially the same plane.

The presently described subject matter is directed to a Li-ion battery, comprising: a Li-ion battery cell; and a battery management system (BMS) connected in electrical series with the Li-ion battery cell, the BMS comprising: a first electrically conductive metal plate; a first set of multiple electronic components positioned along a first edge of the first conductive metal plate, wherein the first set of multiple electronic components are configured to electrically connect the first electrically conductive metal plate to a first module of the BMS; and a second set of multiple electronic components positioned along a second edge of the first conductive metal plate, wherein the second set of multiple electronic components are configured to electrically connect the first electrically conductive metal plate to a second module of the BMS.

The current subject matter will be better understood by reference to the following detailed description when considered in combination with the accompanying drawings which form part of the present specification.

DETAILED DESCRIPTION

Figure 1:
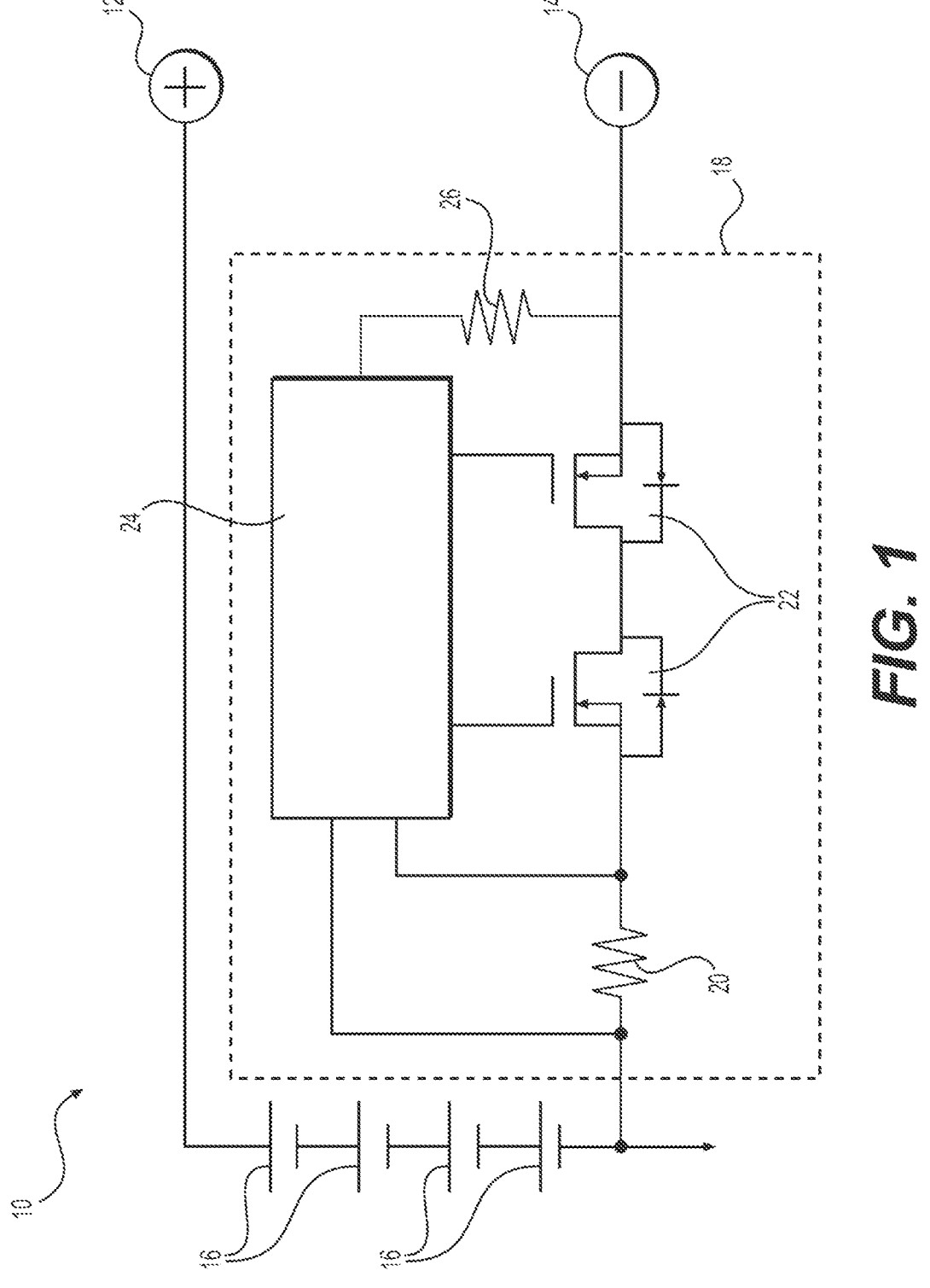
FIG. 1 is a schematic diagram of a lithium ion battery with BMS according to the present disclosure.

A Li-ion battery 10 comprising a positive (+) battery terminal 12, a negative (−) battery terminal 14, multiple Li-ion battery cells 16 (e.g. four (4) Li-ion battery cells shown), and a Battery Management System (BMS) 18 is shown in FIG. 1. The multiple battery cells 16 are arranged in electrical series with the BMS.

The BMS 18 comprises a current sense resistor 20 in electrical series with multiple MOSFETs 22 (e.g. two (2) MOSFETs shown), and a BMS controller 24. The BMS 18 can optionally include resistor 26. The BMS controller 24 is electrically connected to the electronic components of the BMS as shown.

Figure 2:
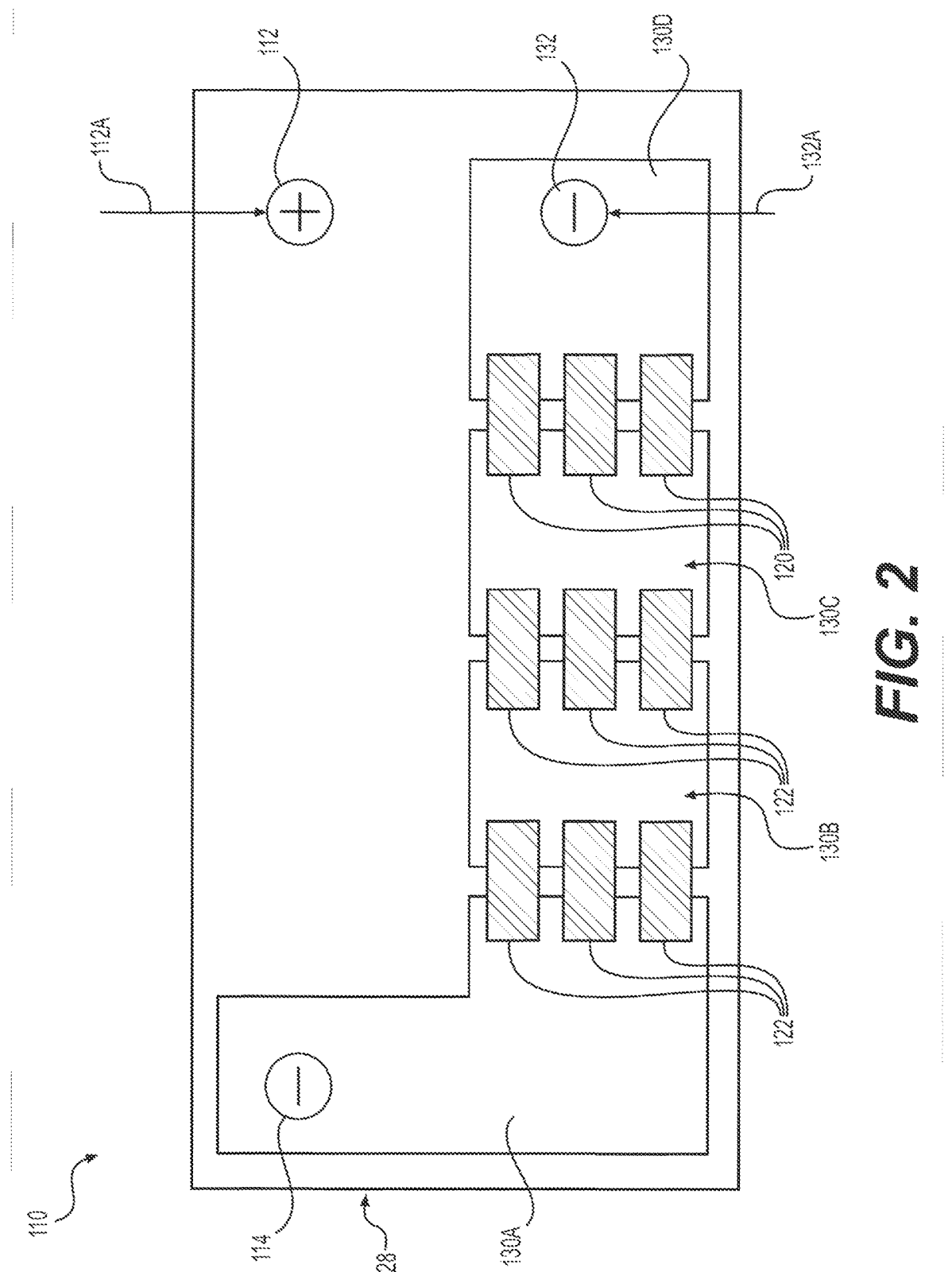
FIG. 2 is a top planar view of a PCB of the BMS with multiple spaced apart copper plates for thermal management according to the present disclosure.

A Li-ion battery 110 with a heat sinking Printed Circuit Board (PCB) 128 according to the present disclosure is shown in FIG. 2. The PCB 128 comprises a positive (+) battery terminal 112 having a positive (+) red wire connection 112A, a negative (−) battery terminal 114, a first electrically conductive metal plate 130A, a second electrically conductive metal plate 130B, a third electrically conductive metal plate 130C, a fourth electrically conductive metal plate 130D, a BMS negative (−) terminal 132 having a negative (−) black wire connection 132A, multiple MOSFETs 122 (e.g. six (6) MOSFETs with three (3) MOSFETs arranged in parallel with two (2) sets of the MOSFETs arranged in series as shown), and multiple current sense resistors 120.

The electrically conductive metal plates 130A, 130B, 130C, 130D, for example, are made of electrically conductive metal or other suitable conductive materials or composites (e.g. copper plate, aluminum plate, nickel plate, silver plate, gold plate, metal clad plate, plated metal plate).

The electrically conductive plates 130A, 130B, 130C, 130D are oriented and spaced apart from each other when assembled onto the PCB 128. For example, the electrically conductive metal plates 130A, 130B, 130C, 130D are copper plates. Further, the electrically conductive metal plate 130A is L-shaped and the electrically conductive metal plates 130B, 130C, 130D are square-shaped. Alternatively, the electrically conductive metal plates can have other shapes (e.g. rectangular, triangle, round, star, U-shaped, custom shape(s)).

The Li-ion battery 110 can be a LCO (Lithium Cobalt Oxide), LTO (Lithium Titanate Oxide), LFP (Lithium Iron Phosphate), LMO (Lithium Manganese Oxide), or NMC (Lithium Nickel Manganese Cobalt) type Li-ion battery, or other suitable Li-ion battery.

The edges of the electrically conductive metal plates 130A, 130B, 130C, 130D are straight edges, and adjacent electrically conductive metal plates are located and oriented to be parallel edge-to-edge and spaced apart a predetermined distance to provide an electrically isolating gap sized to properly connect with or accommodate the electronic components of the BMS 118 bridging the respective gap and connecting respective pairs of the electrically conductive metal plates 130A, 130B, 130C, 130D. Specifically, the gap between the electrically conductive metal plates 130A and 130B and the gap between conductive metal plates 130B and 130C are sized to properly connect with and accommodate the MOSFETs 122 (FIG. 2), and the gap between the electrically conductive metal plates 130C and 130D are sized to properly connect with and accommodate the current sense resistors 120. Alternatively, the electrically conductive plates can have other shaped edges (e.g. round, curved, saw tooth, extensions, custom shaped edge(s)).

Again, the MOSFETs 122 and current sense resistors connect between respective pairs of the electrically conductive metal plates 130A, 130B, 130C, 130D. The gaps located between the electrically conductive metal plates 130A, 130B, 130C, 130D are electrically isolating gaps to prevent electrical current flowing directly between the electrically conductive metal plates 130A, 130B, 130C, 130D, and prevent electrically shorting therebetween. It is note that the substrate of the PCB 128 is made of electrically insulating material preventing electrical current passing therethrough. Further, the gaps are essentially electrically isolating air gaps located between the edges of the electrically conductive metal plates 130A, 130B, 130C, 130D.

The electrically conductive metal plates 130A, 130B, 130C, 130D can be made of copper, copper alloys, plated copper, aluminum, brass, bronze, tin, nickel, silver, or other suitable metals. Specifically, copper plates are made of Grade 110 copper, Grade 101 copper, Grade 145 copper, and other suitable grades of copper.

Figure 3:
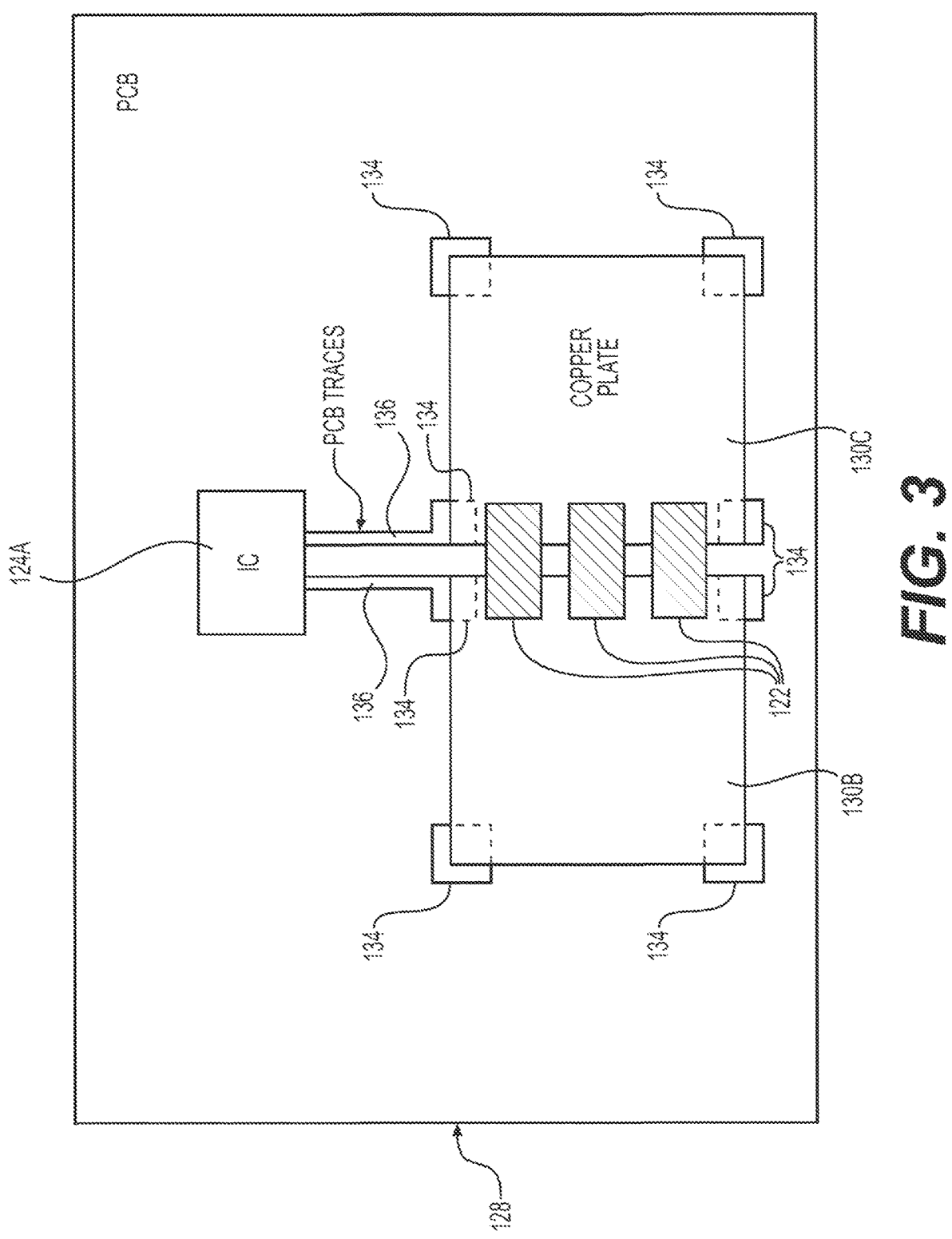
FIG. 3 is a top planar view illustrating the copper plate attachment to the PCB of the BMS.
Figure 5:
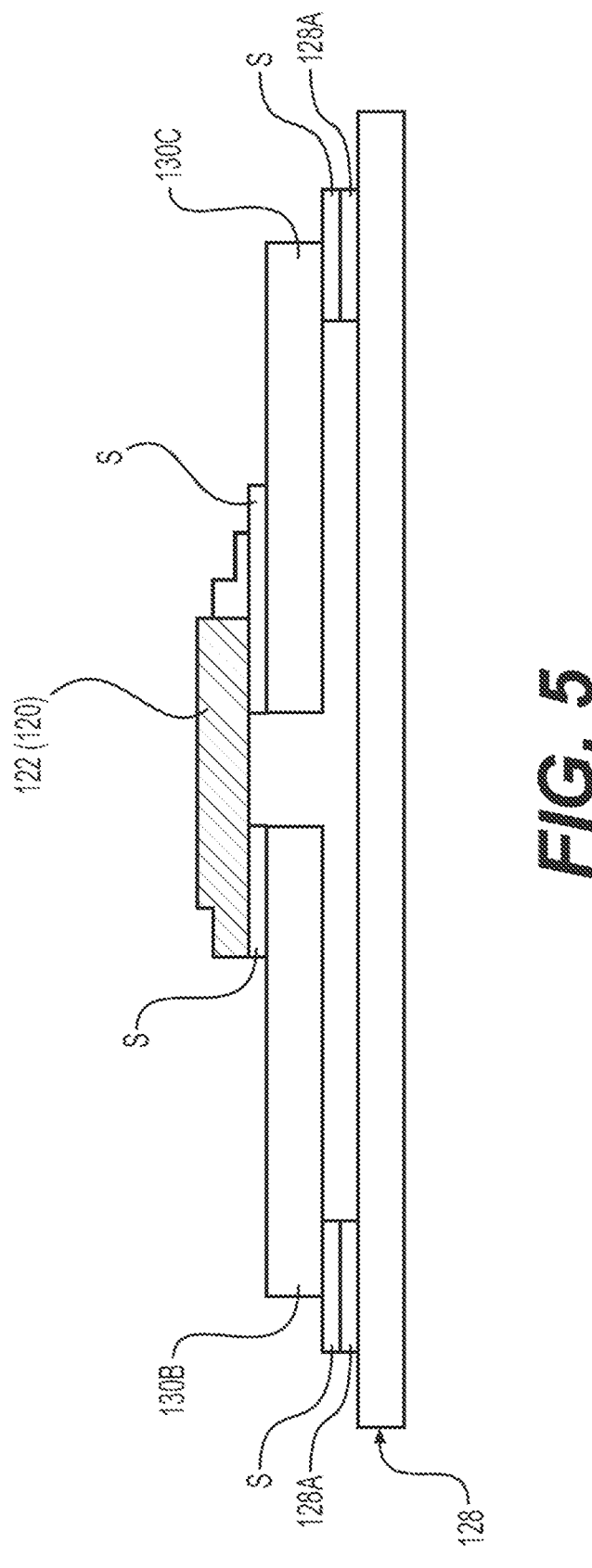
FIG. 5 is a more detailed side view of the PCB of the BMS shown in FIG. 3 also showing the soldered layer of the copper plate attachment.

The structure and arrangement of a portion of the heat sinking Printed Circuit Board (PCB) 128 is shown in FIG. 3. The PCB 128 is provided with electrically conductive metal pads 134 (e.g. square-shaped copper pads) serving as anchoring points, regions, or devices on the PCB 128, as shown in FIG. 5. The electrically conductive metal pads 134 are located so that the electrically conductive metal plates 130B, 130C can be soldered to connect or install the electrically conductive metal plates 130B, 130C onto PCB 128. For example, the electrically conductive metal pads 134 are located on the PCB 128 so that the corners of the electrically conductive metal plates 130B, 130C are located (e.g. centered) on the electrically conductive metal pads 134, as shown in FIG. 3. Alternatively, the electrically conductive metal plates can be attached to the electrically conductive metal pads 134 along their edges and/or underneath the electrically conductive metal plates. The electrically conductive metal pads 134 can comprise a single metal layer or multiple metal layers. In some case the BMS PCB can duplicate the PCB electrically conductive metal pads 134 in multiple layers on the PCB, and connect these layers with multiple vias. A via is a drilled and plated hole between layers. The vias provide electrical and thermal conductivity between layers. This provides additional heat spreading and heat sinking to improve thermal performance. Further, the electrically conductive metal pads 134 can be provided with one or more layers of metal plates located between the electrically conductive metal pads 134 and electrically conductive metal plates 130A, 130B, 130C, 130D to enhance heat sinking.

The electrically conductive metal plates 130B, 130C are soldered to the respective electrically conductive metal pads 134. For example, electrically conductive metal pads 134 are provided and located at one or more corners of the electrically conductive metal plates 130A, 130B, 130C, 130D. Alternatively, a single metal pad can be used to attach each electrically conductive metal plate 130A, 130B, 130C, 130D to the PCB 128. For example, single electrically conductive metal pads can each connect each of electrically conductive metal plate 130A, 130B, 130C, 130D to the PCB 128 (i.e. a single metal pad for each electrically conductive metal plate 130A, 130B, 130C, 130D.

A pair of electrical traces 136 electrically connect an integrated circuit (IC) 124A of the BMS controller 124 (FIG. 1) to the electrically conductive metal plates 130B, 130C. The same structure or construction of the portion of the heat sinking PCB 128 also applies to the electrically conductive metal plates 130B, 130D.

Figure 4:
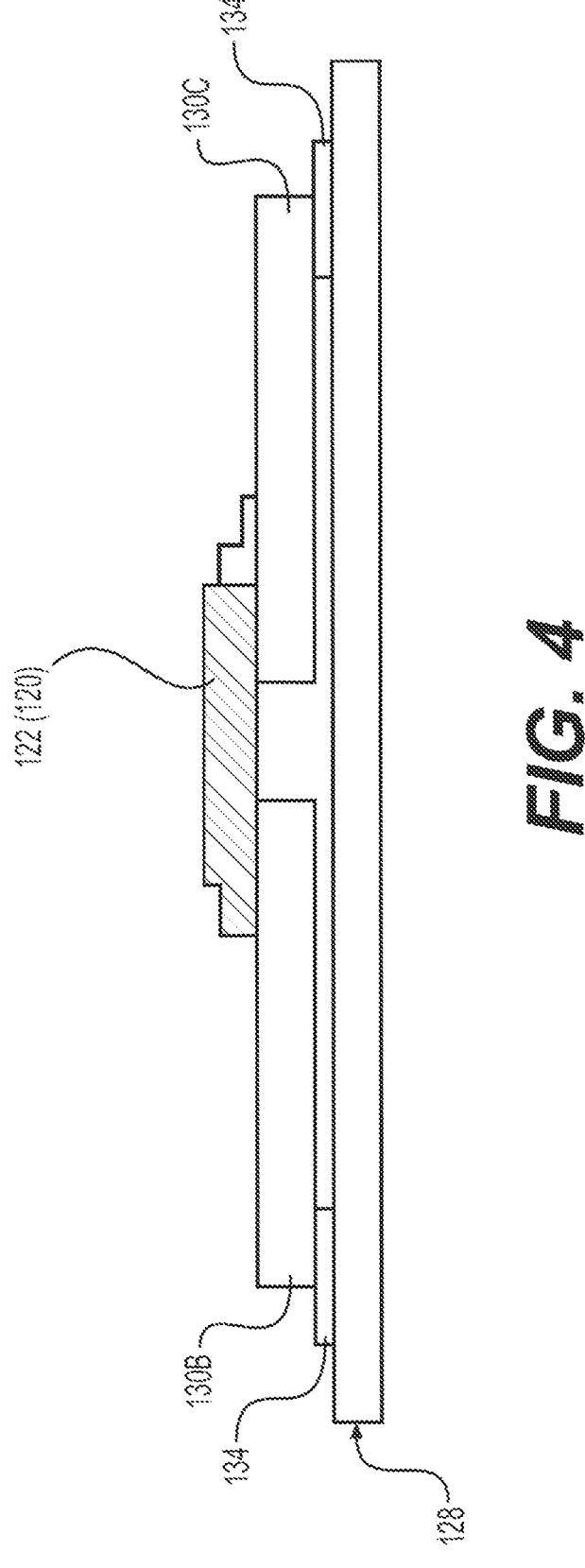
FIG. 4 is a side view of the PCB shown in FIG. 3 illustrating the copper plate attachment for thermal management.

The MOSFETs 122 and current sense resistors 120 (i.e. electrical components of the BMS) each have spaced apart connectors directly soldered to adjacent pairs of the electrically conductive metal plates 130A, 130B, 130C, 130D, as shown in FIG. 4. Again, the electrically conductive metal plates 130B, 130C are soldered to the respective electrically conductive metal pads 134.

Figure 6:
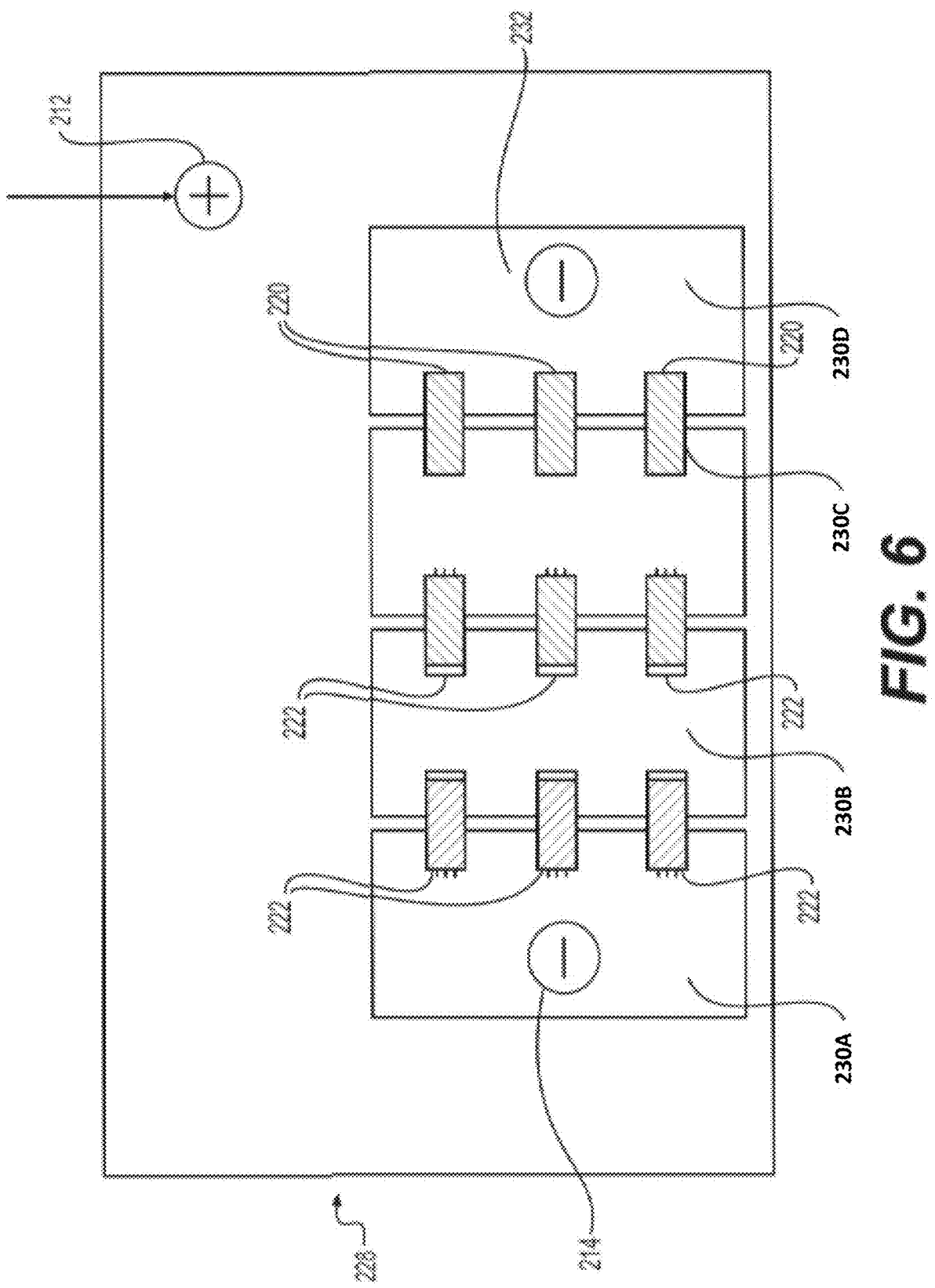
FIG. 6 is a top planar view of another PCB of another BMS with multiple spaced apart copper plates for thermal management according to the present disclosure. This figure shows a linear layout for the BMS components. This layout is difficult to fit into space constrained applications

Another heat sinking Printed Circuit Board (PCB) 228 according to the present disclosure is shown in FIG. 6. The PCB 228 comprises a positive (+) battery terminal 212 having a positive (+) red wire connection 212A, a negative (−) battery terminal 214, a first electrically conductive metal plate 230A, a second electrically conductive metal plate 230B, a third electrically conductive metal plate 230C, a fourth electrically conductive metal plate 230D, a BMS negative (−) terminal 232 having a negative (−) black wire connection 232A, multiple MOSFETs 222 (e.g. six (6) MOSFETs with three (3) MOSFETs arranged in parallel with two (2) sets of the MOSFETs arranged in series as shown), and multiple current sense resistors 220. The electrically conductive metal plates 230A, 230B, 230C, 230D, for example, are made of electrically conductive metal or other suitable conductive materials or composites (e.g. copper plate, aluminum plate, nickel plate, silver plate, gold plate, metal clad plate, plated metal plate).

The electrically conductive plates 230A, 230B, 230C, 230D are oriented and spaced apart from each other when assembled onto the PCB 228. For example, the electrically conductive metal plates 230A, 230B, 230C, 230D are copper plates. Further, the electrically conductive metal plates 230A, 230B, 230C, 230D are rectangular-shaped. Alternatively, the electrically conductive metal plates can have other shapes (e.g. square, triangle, round, star, U-shaped, custom shape(s)).

Figure 7:
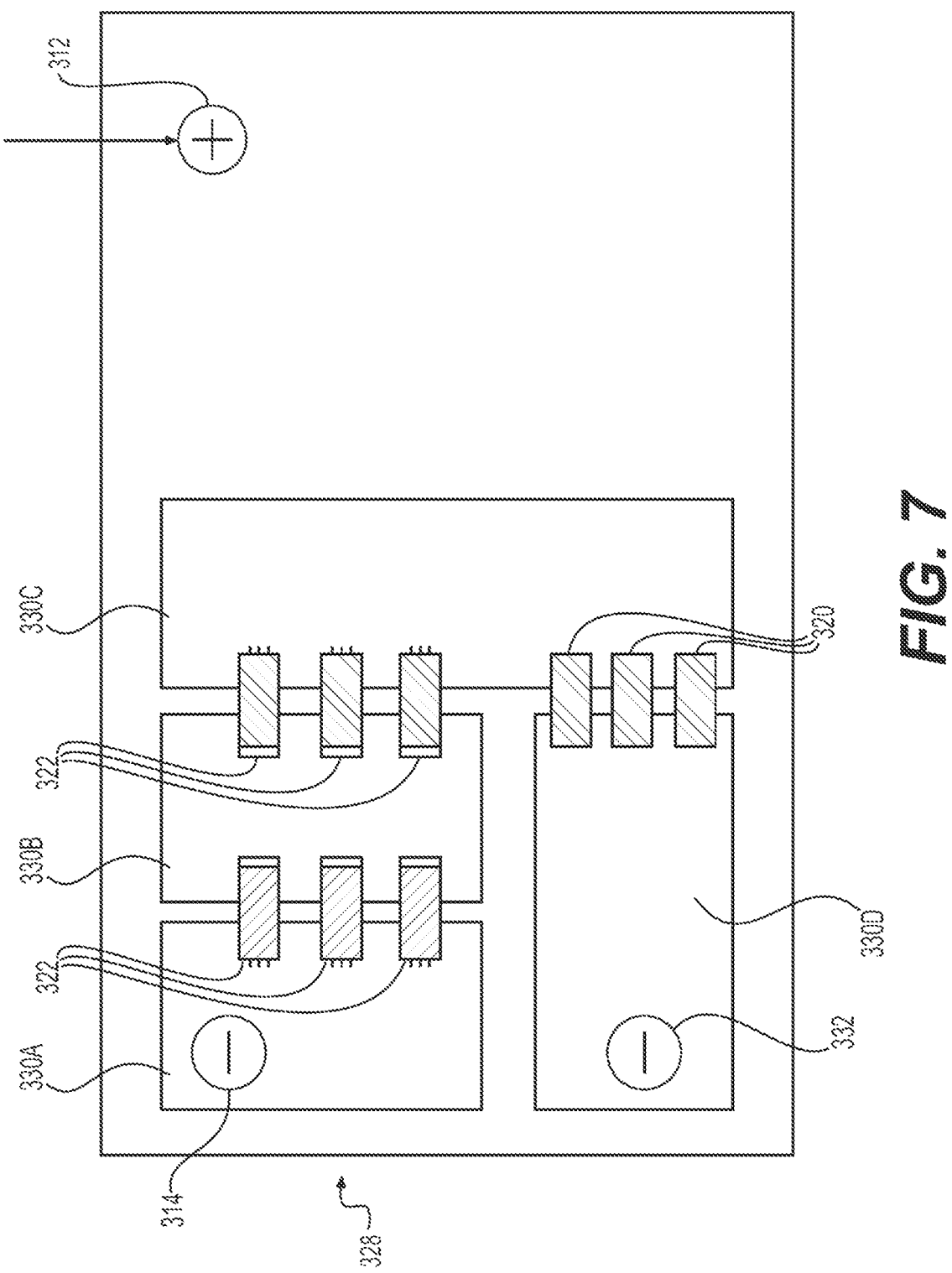
FIG. 7 is a top planar view of a further PCB of a further BMS with multiple spaced apart copper plates for thermal management according to the present disclosure. This figure shows a modified BMS layout that allows fit into a smaller space, but compromises current sharing.

A further heat sinking Printed Circuit Board (PCB) 328 according to the present disclosure is shown in FIG. 7. The PCB 328 comprises a positive (+) battery terminal 312 having a positive (+) red wire connection 312A, a negative (−) battery terminal 314, a first electrically conductive metal plate 330A, a second electrically conductive metal plate 330B, a third electrically conductive metal plate 330C, a fourth electrically conductive metal plate 330D, a BMS negative (−) terminal 332 having a negative (−) black wire connection 332A, multiple MOSFETs 322 (e.g. six (6) MOSFETs with three (3) MOSFETs arranged in parallel with two (2) sets of the MOSFETs arranged in series as shown), and multiple current sense resistors 320.

The electrically conductive metal plates 330A, 330B, 330C, 330D, for example, are made of electrically conductive metal or other suitable conductive materials or composites (e.g. copper plate, aluminum plate, nickel plate, silver plate, gold plate, metal clad plate, plated metal plate).

The electrically conductive plates 330A, 330B, 330C, 330D are oriented and spaced apart from each other when assembled onto the PCB 328. For example, the electrically conductive metal plates 330A, 330B, 330C, 330D are copper plates. Further, the electrically conductive metal plates 330A, 330B, 330C, 330D are rectangular-shaped. Alternatively, the electrically conductive metal plates can have other shapes (e.g. square, triangle, round, star, U-shaped, custom shape(s)).

Figure 8:
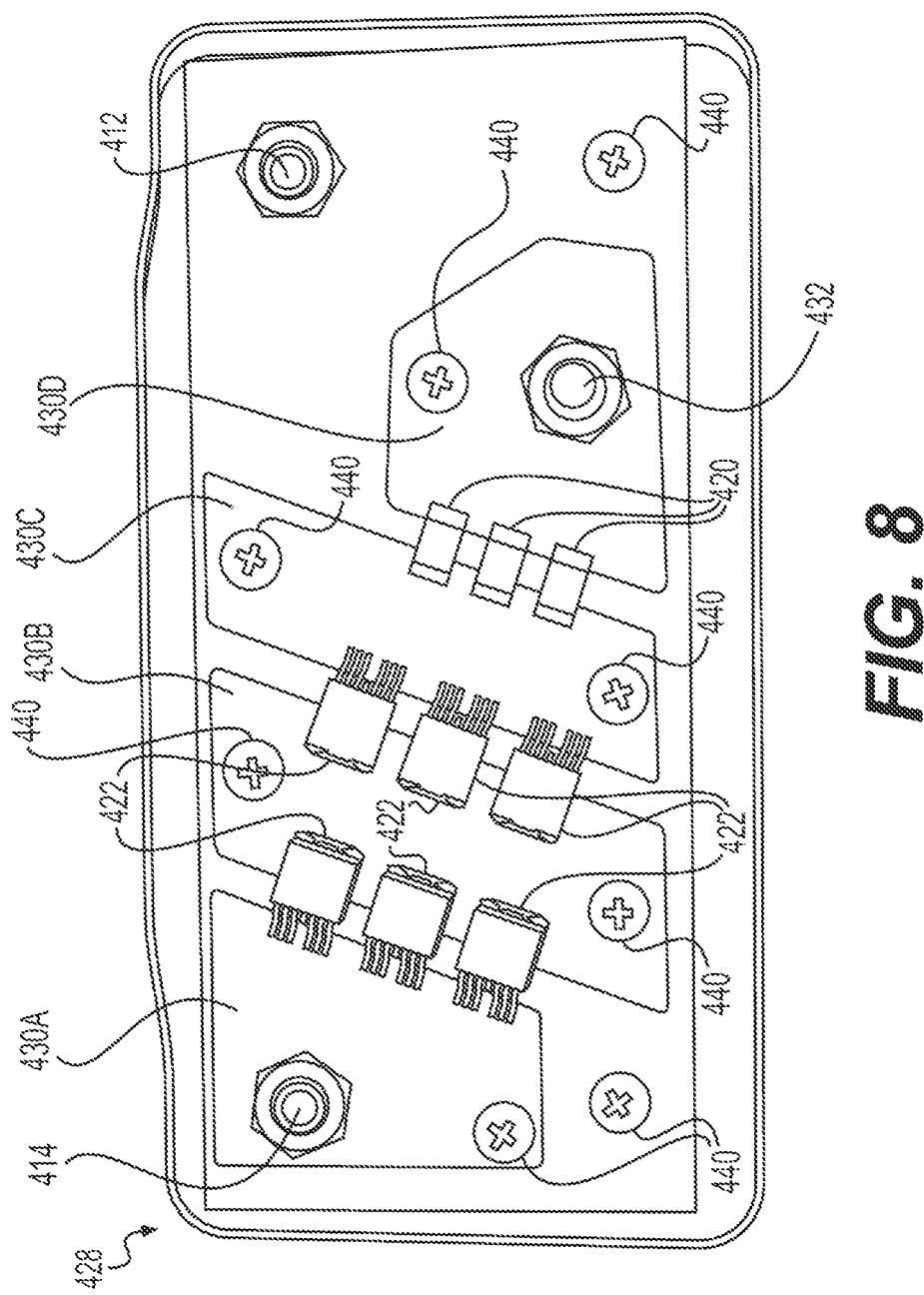
FIG. 8 is a top planar view of an even further BMS having an even further PCB with multiple spaced apart copper plates for thermal management according to the present disclosure. This figure shows a compact BMS component arrangement. The components are arranged diagonally across the battery to maximize heatsinking area, and ensure equal current sharing. This example is for a negative side BMS, but applies equally to a positive side BMS. This example also shows copper plates used as heatsinking, but applies equally to other heatsinking methods such as PCB copper fills or traces. The diagonal current path through the components (from upper left corner to lower right corner of PCB) provides a current sharing advantage of this arrangement.

An even further heat sinking Printed Circuit Board (PCB) 428 according to the present disclosure is shown in FIG. 8. The PCB 428 is illustrated as being positioned within a battery housing case. The PCB 428 comprises a positive (+) battery terminal 412, a negative (−) battery terminal 414, a first electrically conductive metal plate 430A, a second electrically conductive metal plate 430B, a third electrically conductive metal plate 430C, a fourth electrically conductive metal plate 430D, a BMS negative (−) terminal 432, multiple MOSFETs 422 (e.g. six (6) MOSFETs with three (3) MOSFETs arranged in parallel with two (2) sets of the MOSFETs arranged in series as shown), and multiple current sense resistors 420.

The MOSFETs 422 and current sense resistors 420 are oriented diagonally on the PCB 428. This provides a compact arrangement of the MOSFETs 422 and current sense resistors 420 on the PCB 428.

Further, the electrically conductive metal plates 430A, 430B, 430C, 430D are oriented diagonally relative to the edges of the rectangular-shaped PCB 428. Specifically, a center longitudinal axis of the electrically conductive metal plates 430A, 430B, 430C, 430D are oriented diagonally relative to the edges of the rectangular-shaped PCB 428. Alternatively, or in addition, one or more edges of the electrically conductive metal plates 430A, 430B, 430C, 430D accommodating the MOSFETs 422 and/or current sense resistors 420 are oriented diagonally relative to the edges of the rectangular-shaped PCB 428.

The electrically conductive metal plates 430A, 430B, 430C, and 430D are made of electrically conductive metal or other suitable conductive materials or composites (e.g. copper plate, aluminum plate, nickel plate, silver plate, gold plate, metal clad plate, plated metal plate).

The electrically conductive plates 430A, 430B, 430C, 430D are diagonally oriented and spaced apart from each other when assembled onto the PCB 428. For example, the electrically conductive metal plates 430A, 430B, 430C, 430D are copper plates. Further, the electrically conductive metal plates 430B and 430C are shown as having a trapezoid shape, and electrically conductive metal plates 430A and

430D have multiple sides with at least one diagonally oriented edge 430AA, 430DA oriented along a diagonal relative to edges of the rectangular-shaped PCB 428. Alternatively, the electrically conductive metal plates can have other shapes (e.g. square, rectangle); however, oriented along a diagonal axis relative to edges of the rectangular-shaped PCB 428.

Figure 9:
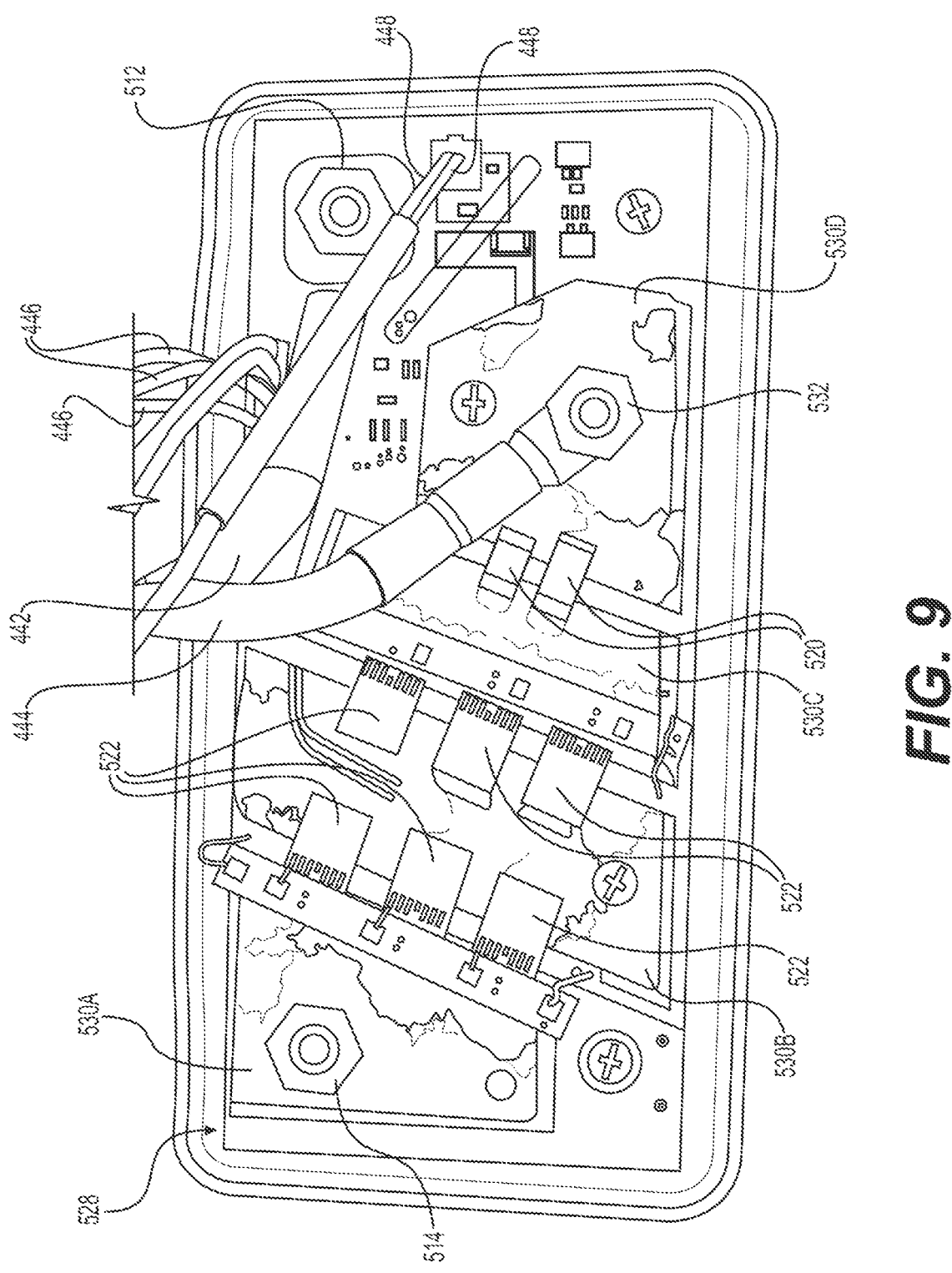
FIG. 9 is a top planar view of the BMS shown in FIG. 8 connected to the positive and negative cables and wiring.

Another heat sinking Printed Circuit Board (PCB) 528 installed within a rechargeable battery according to the present disclosure is shown in FIG. 9. The PCB 528 comprises a positive (+) battery terminal 512, a negative (−) battery terminal 514, a first electrically conductive metal plate 530A, a second electrically conductive metal plate 530B, a third electrically conductive metal plate 530C, a fourth electrically conductive metal plate 530D, a BMS negative (−) terminal 532, multiple MOSFETs 522 (e.g. six (6) MOSFETs with three (3) MOSFETs arranged in parallel with two (2) sets of the MOSFETs arranged in series as shown), and multiple current sense resistors 520.

The MOSFETs 522 and current sense resistors 520 are oriented diagonally on the PCB 528. This provides a more compact arrangement of the MOSFETs 522 and current sense resistors 520 on the 5CB 428 compared to vertically and/or horizontally oriented arrangements relative to the edges of a rectangular-shaped PCB.

Further, the electrically conductive metal plates 530A, 530B, 530C, 530D are oriented diagonally relative to the edges of the rectangular-shaped PCB 528. Specifically, a center longitudinal axis of the electrically conductive metal plates 530A, 530B, 530C, 530D are oriented diagonally relative to the edges of the rectangular-shaped PCB 528. Alternatively, or in addition, one or more edges of the electrically conductive metal plates 530A, 530B, 530C, 530D accommodating the MOSFETs 522 and/or current sense resistors 520 are oriented diagonally relative to the edges of the rectangular-shaped PCB 528.

The electrically conductive metal plates 530A, 530B, 530C, and 530D are made of electrically conductive metal or other suitable conductive materials or composites (e.g. copper plate, aluminum plate, nickel plate, silver plate, gold plate, metal clad plate, plated metal plate).

The electrically conductive plates 530A, 530B, 530C, 530D are diagonally oriented and spaced apart from each other when assembled onto the PCB 528. For example, the electrically conductive metal plates 530A, 530B, 530C, 530D are copper plates. Further, the electrically conductive metal plates 530B and 530C are shown as having a trapezoid shape, and electrically conductive metal plates 530A and 530D have multiple sides with at least one diagonally oriented edge 530AA, 530DA oriented along diagonal axes relative to edges of the rectangular-shaped PCB 528. Alternatively, the electrically conductive metal plates can have other shapes (e.g. square, rectangle); however, center axis of the plates are oriented along a diagonal axis relative to edges of the rectangular-shaped PCB 528.

A positive cable 442 of the BMS is connected to the positive (+) battery terminal and a negative cable 444 of the BMS is connected to the negative (−) battery terminal. A set of wires 448 connects the PCB 528 to the BMS controller (e.g. BMS controller 24 shown in FIG. 1).

Figure 10:
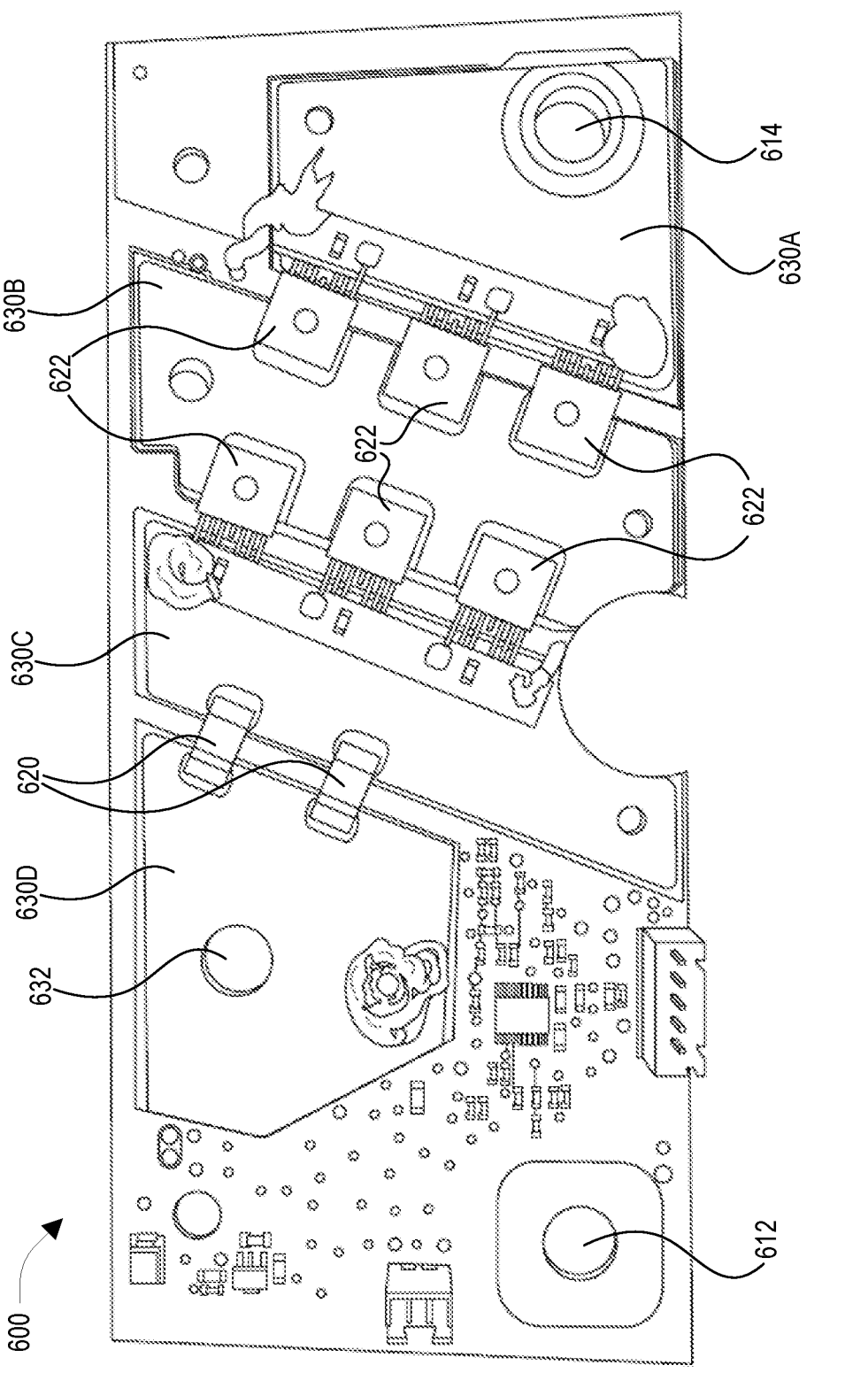
FIG. 10 is a top view of another BMS having a PCB with multiple spaced apart copper plates for thermal management. Similar to the BMS of FIGS. 8-9, this figure shows a compact BMS component arrangement where the components are arranged diagonally across the battery.

Yet another heat sinking Printed Circuit Board (PCB) 600 configured to be installed within a rechargeable battery is shown in FIG. 10. Similar to the heat sinking PCBs of FIGS. 8-9, the PCB 600 comprises a positive (+) battery terminal 612, a negative (−) battery terminal 614, a first electrically conductive metal plate 630A, a second electrically conductive metal plate 630B, a third electrically conductive metal plate 630C, a fourth electrically conductive metal plate 630D, a BMS negative (−) terminal 632, multiple MOSFETs 622 (e.g. six MOSFETs with three MOSFETs arranged in parallel with two sets of the MOSFETs arranged in series as shown), and two current sense resistors 620.

The MOSFETs 622 and current sense resistors 620 are again oriented diagonally on the PCB 600. This provides a compact arrangement of the MOSFETs 622 and current sense resistors 620 on the PCB 628. Further, the electrically conductive metal plates 630A, 630B, 630C, 630D are oriented diagonally relative to the edges of the rectangular-shaped PCB 628. Specifically, a center longitudinal axis of the electrically conductive metal plates 630A, 630B, 630C, 630D are oriented diagonally relative to the edges of the rectangular-shaped PCB 628.

The electrically conductive metal plates 630A, 630B, 630C, and 630D are made of electrically conductive metal or other suitable conductive materials or composites (e.g. copper plate, aluminum plate, nickel plate, silver plate, gold plate, metal clad plate, plated metal plate). For example, the electrically conductive metal plates 430A, 430B, 430C, 430D are copper plates. Further, the electrically conductive metal plates 430B and 430C are shown as having a trapezoid shape, and electrically conductive metal plates 430A and 430D have multiple sides with at least one diagonally oriented edge 430AA, 430DA oriented along a diagonal relative to edges of the rectangular-shaped PCB 428. Alternatively, the electrically conductive metal plates can have other shapes (e.g. square, rectangle).

Although the battery management systems referenced in FIGS. 8-10 rely on a diagonal heat sinking structure and arrangement for improved heat sinking capabilities, it should be appreciated that, in other embodiments, a BMS may have elements that are not positioned in a diagonal arrangement. For instance, FIGS. 2-7 depict various battery management systems that include electrically conductive metal plates that have sides oriented parallel or perpendicular to edges of the respective rectangular-shaped PCBs.

Distinct Copper Plates

Although some of the battery management systems described herein rely on one or more electrically conductive metal plates that are positioned as components on a surface of a printed circuit board, it should also be appreciated that a BMS can also achieve the desired heat sinking capabilities by using electrically conductive metal plates that are spatially separated from any such PCB. By separating the electrically conductive metal plates from the PCB, spatial limitations as well as the attachment challenges associated with connecting metal plates to a PCB can be alleviated.

Figure 11:
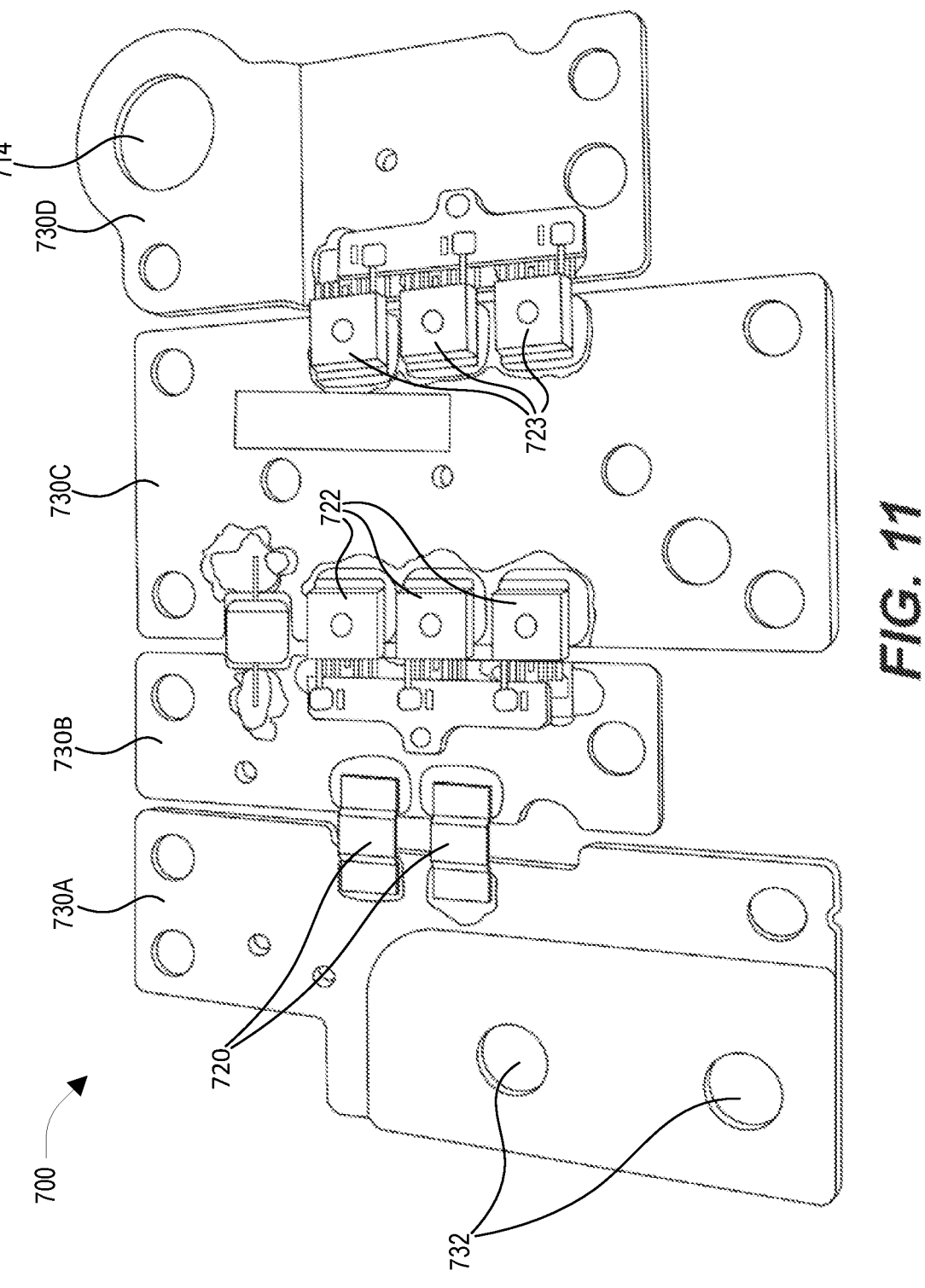
FIG. 11 is a top view of a thermal subsystem of yet another BMS having multiple copper plates spaced apart for thermal management. Unlike FIGS. 8-10, the thermal subsystem is not positioned on a PCB as a subcomponent. This example is for a negative side BMS, but applies equally to a positive side BMS.

FIG. 11 depicts a thermal subsystem 700 of battery management system for use in a rechargeable battery, wherein the thermal subsystem 700 includes several electrically conductive metal plates that are not positioned on a PCB. Specifically, the thermal subsystem 700 includes, a negative (−) battery terminal 714, a first electrically conductive metal plate 730A, a second electrically conductive metal plate 730B, a third electrically conductive metal plate 730C, a fourth electrically conductive metal plate 730D, and two BMS negative (−) terminals 732. The thermal subsystem 700 also includes multiple electronic components electrically connected between the electrically conductive metal plates 730A, 730B, 730C, 730D, including a first set of MOSFETs 722 (e.g. three MOSFETs arranged in parallel)

arranged in series with a second set of MOSFETs 723 (three additional MOSFETs arranged in parallel), and two current sense resistors 720.

The electrically conductive metal plates 730A, 730B, 730C, 730D are sized and arranged as required to maintain the temperature rise of the multiple electronic components within their specified operating limits. The electrically conductive metal plates 730A, 730B, 730C, 730D are also arranged as required to fit inside a battery system, and to provide for equal current sharing between parallel electronics components. The electrically conductive metal plates 730A, 730B, 730C, 730D may be thicker or thinner depending on the current carrying and thermal requirements of the BMS. For instance, the electrically conductive metal plates 730A, 730B, 730C, 730D may be at least 1/16 inch thick, or at least 1/8 inch thick. The electrically conductive plates 730A, 730B, 730C, 730D may have widths and/or heights that are at least 5 times, or at least 10 times the value of their respective thicknesses. Furthermore, as shown, the electrically conductive plates 730A, 730B, 730C, 730D are oriented and spaced apart from each other in substantially the same horizontal plane, which allows the BMS to fit within the confined spatial restraints of typical battery arrangements. The top surfaces of the electrically conductive plates 730A, 730B, 730C, 730D are substantially parallel in the areas connected by the multiple electronic components.

The electrically conductive metal plates 730A, 730B, 730C, 730D are substantially rectangular in shape. Alternatively, the electrically conductive metal plates 730A, 730B, 730C, 730D can have other shapes (e.g. rectangular, triangle, round, star, U-shaped, custom shape(s)). The edges of the electrically conductive metal plates 730A, 730B, 730C, 730D are substantially straight, and adjacent electrically conductive metal plates are located and oriented to be parallel edge-to-edge. Alternatively, one or more pairs of the electrically conductive metal plates 730A, 730B, 730C, 730D may each have one or more diagonally oriented edges accommodating the multiple electronic components. Alternatively, the electrically conductive metal plates 730A, 730B, 730C, 730D can have other shaped edges (e.g. round, curved, saw tooth, extensions, custom shaped edge(s)). The electrically conductive metal plates 730A, 730B, 730C, 730D include multiple apertures configured to provide attachment points by which the metal plates may be affixed to a surface (e.g. battery case) or by which additional components (e.g. wires, PCBs) can be affixed or connected to the plates themselves.

The electrically conductive metal plates 730A, 730B, 730C, 730D are spaced apart at a predetermined distance to provide an electrically isolating gap sized to properly connect with or accommodate the electronic components of the BMS bridging the respective gap and connecting respective pairs of the electrically conductive metal plates 730A, 730B, 730C, 730D. Specifically, the gap between the electrically conductive metal plates 730B and 730C and the gap between conductive metal plates 730C and 730D are sized to properly connect with and accommodate the respective sets of MOSFETs 722 and 723. Likewise, the gap between the electrically conductive metal plates 730A and 730B are sized to properly connect with and accommodate the current sense resistors 720.

As previously described, the electrical components, such as the MOSFETs 122 and current sense resistors 720, connect between respective pairs of the electrically conductive metal plates 730A, 730B, 730C, 730D. The MOSFETs 122 and current sense resistors 720 may be attached to the electrically conductive metal plates 730A, 730B, 730C, 730D using soldering, or where soldering is unsuitable, using mechanical fasteners or other attachment techniques. The gaps located between the electrically conductive metal plates 730A, 730B, 730C, 730D are electrically isolating gaps to prevent electrical current flowing directly between the electrically conductive metal plates 730A, 730B, 730C, 730D, and prevent electrically shorting therebetween.

The electrically conductive metal plates 730A, 730B, 730C, 730D are made of electrically conductive metal or other suitable conductive materials or composites (e.g. copper plate, aluminum plate, nickel plate, silver plate, gold plate, metal clad plate, plated metal plate). For instance, the electrically conductive metal plates 730A, 730B, 730C, 730D can be made of copper, copper alloys, plated copper, aluminum, brass, bronze, tin, nickel, silver, or other suitable metals. The electrically conductive metal plates 730A, 730B, 730C, 730D may specifically be copper plates, made of Grade 110 copper, Grade 101 copper, Grade 145 copper, and other suitable grades of copper.

Figure 12:
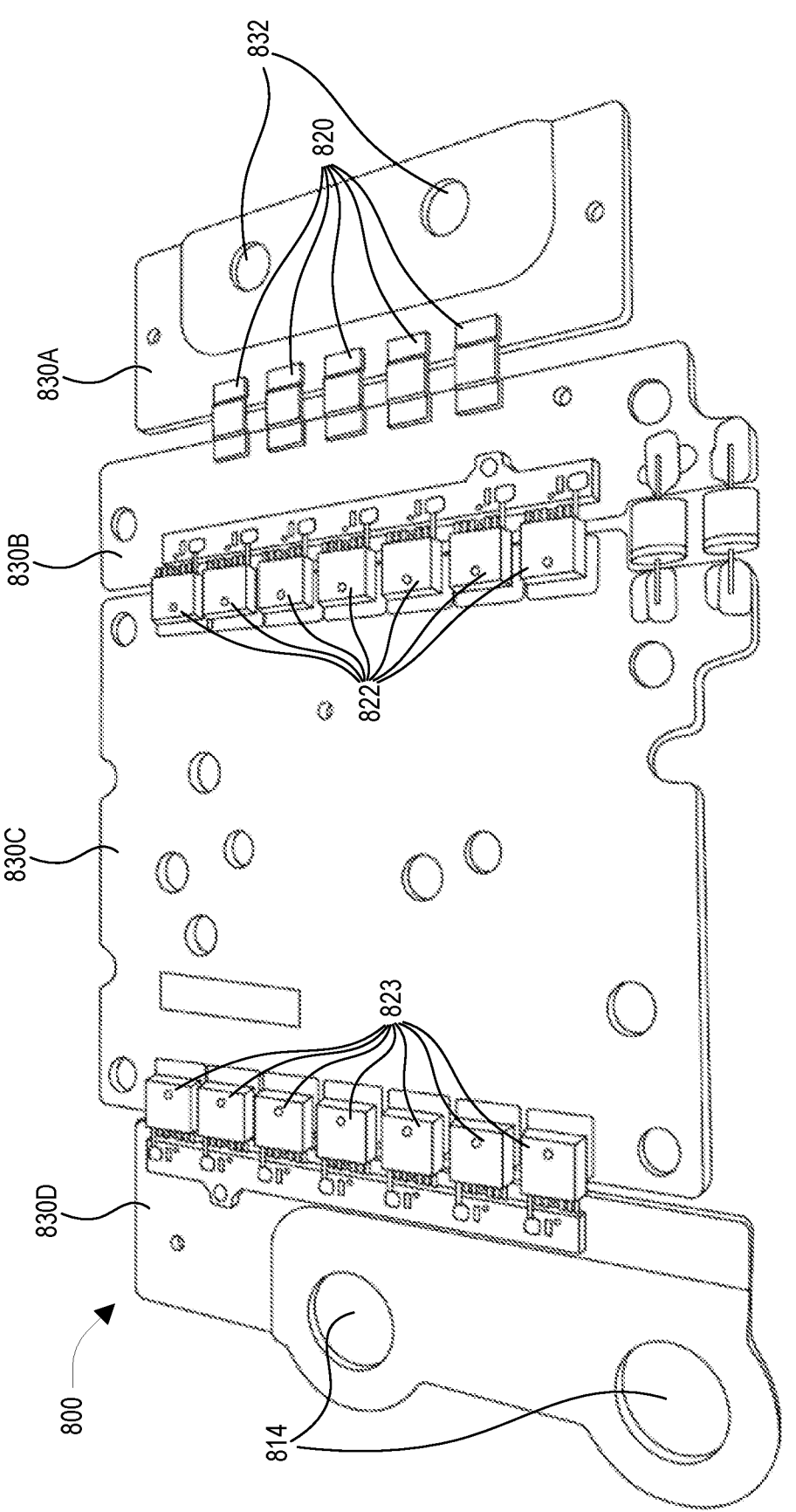
FIG. 12 is a top view of a thermal subsystem of still another BMS having multiple copper plates spaced apart for thermal management. Like in FIG. 11, the thermal subsystem is not positioned on a PCB as a subcomponent. This example is for a negative side BMS, but applies equally to a positive side BMS.

FIG. 12 depicts a thermal subsystem 800 of another battery management system for use in a rechargeable battery. Similar to FIG. 11, the thermal subsystem 800 of the BMS includes two negative (−) battery terminals 814, a first electrically conductive metal plate 830A, a second electrically conductive metal plate 830B, a third electrically conductive metal plate 830C, a fourth electrically conductive metal plate 830D, and two BMS negative (−) terminals 832. The thermal subsystem 800 also includes multiple electronic components electrically connected between the electrically conductive metal plates 830A, 830B, 830C, 830D, including a first set of MOSFETs 822 (e.g. six MOSFETs arranged in parallel) arranged in series with a second set of MOSFETs 823 (six additional MOSFETs arranged in parallel), and five current sense resistors 820.

The third electrically conductive metal plate 830C is configured so that a PCB may be affixed onto its top surface. Specifically, the third electrically conductive metal plate 830C includes several apertures that function as attachment points for a PCB. The PCB is connected to the third electrically conductive metal plate 830C in a manner that it does not disturb the multiple electronic components attached thereto. The third electrically conductive metal plate 830C has a larger top surface area than the other electrically conductive metal plates 830A, 830B, and 830D, so that it can provide sufficient area for the heat generated by the MOSFETs 822, 823 to dissipate.

Figure 13:
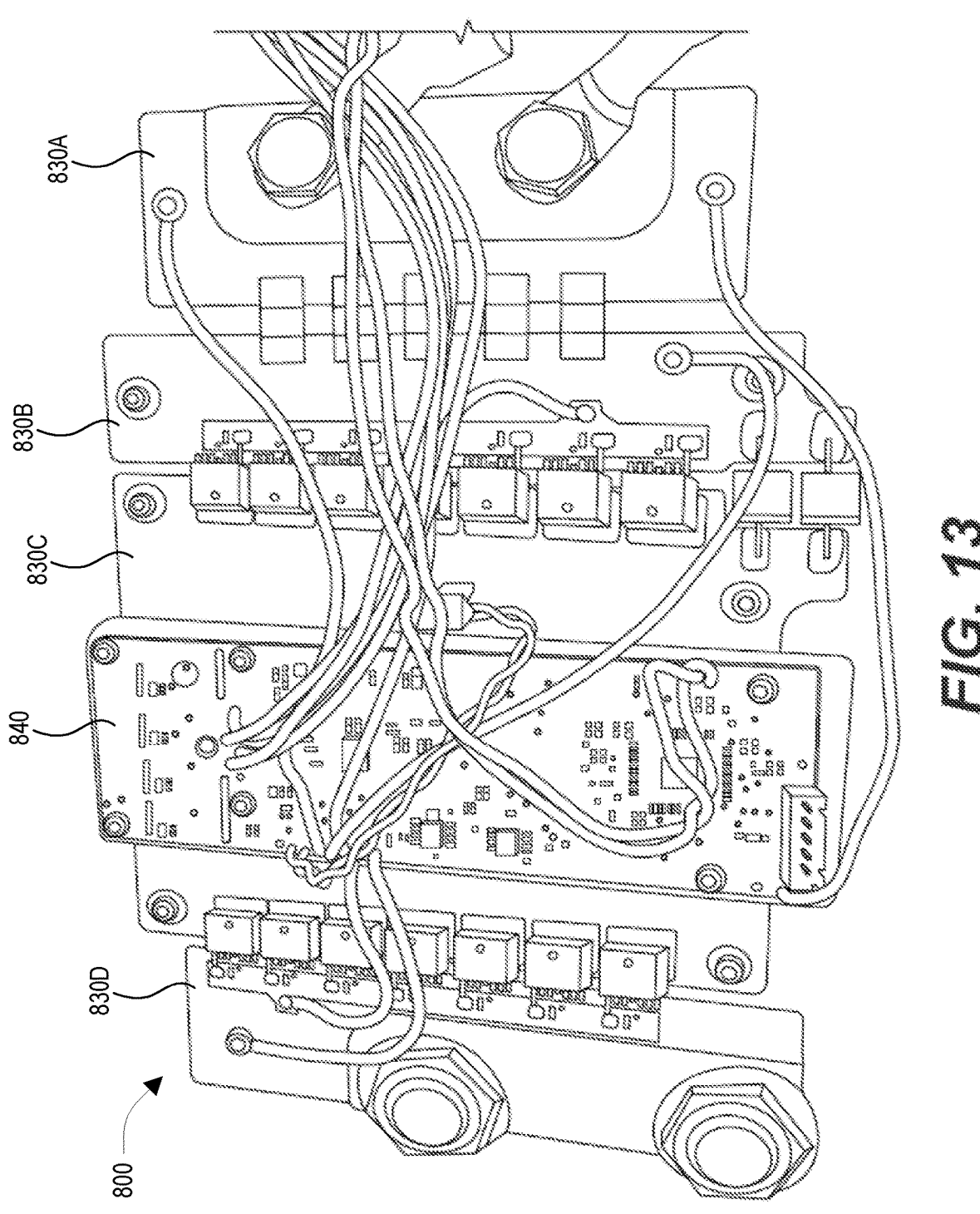
FIG. 13 is a top view of the thermal subsystem shown in FIG. 12 connected to the positive and negative cables and wiring, as well as a PCB, which is positioned on one of the copper plates.

FIG. 13 depicts the thermal subsystem 800 of FIG. 12 connected to the negative cables and wiring, as well as a bottom side of a controller PCB 840, thereby forming a BMS. As shown, the controller PCB 840 is in electrical communication with several of the electrically conductive metal plates (830A, 830B, and 830D), as well as the various sets of MOSFETs. In this manner, the battery management system includes a controller PCB 840 electrically connected to the multiple MOSFETs and the multiple current sense resistors. The controller PCB 840 and the electrically conductive metal plates 830A, 830B, 830C, and 830D are arranged within substantially the same plane. The third electrically conductive metal plate has one or more apertures configured to align with one or more apertures on the bottom side of the PCB in a manner that the PCB can be securely connected to the third electrically conductive metal plate. Although the controller is depicted as a single integrated circuit in some aspects described herein, the controller may instead by formed of multiple separate components, which work together to provide the desired control functionality.

Figure 14:
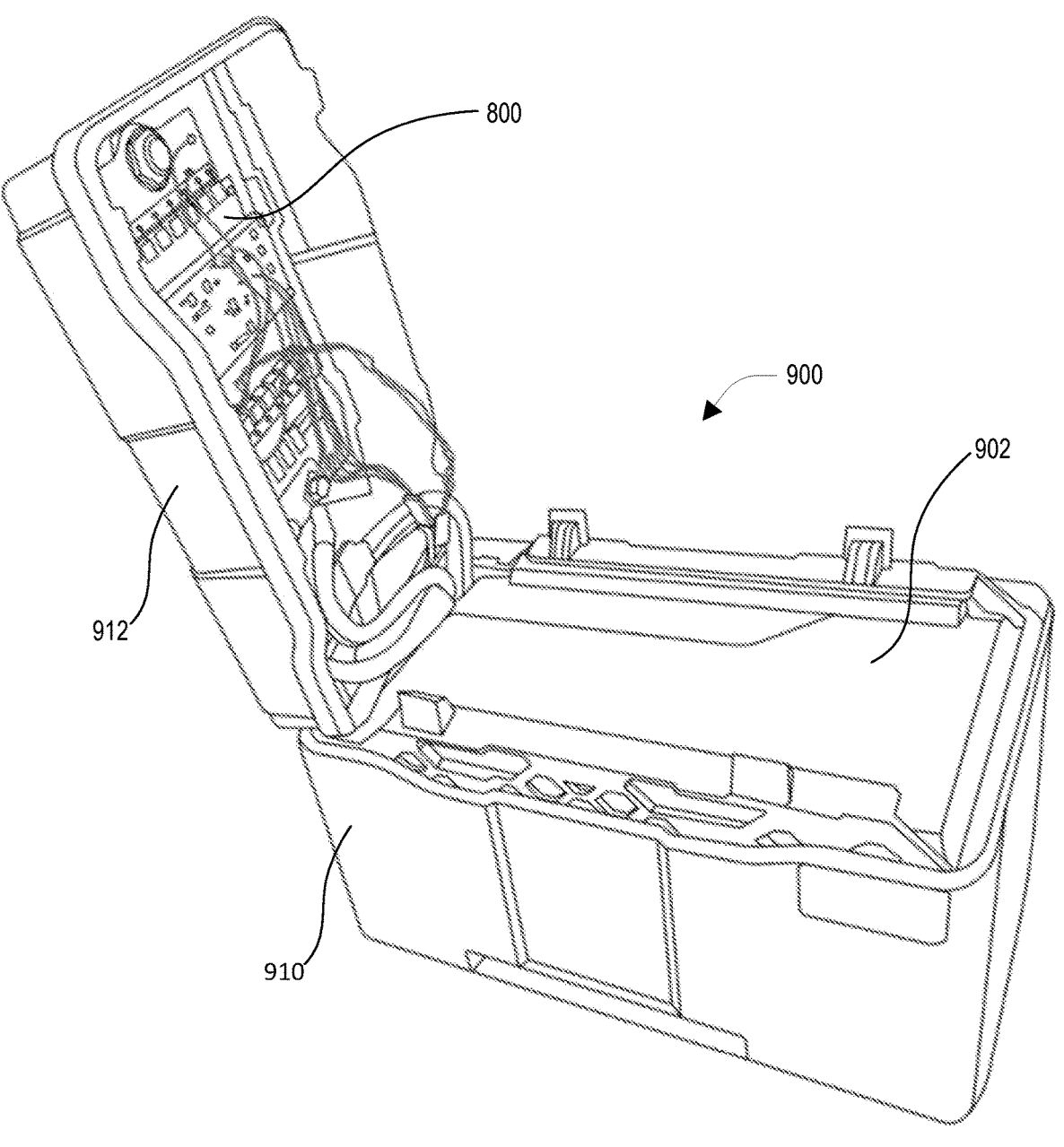
FIG. 14 is an isometric view of a battery and BMS including the thermal subsystem shown in FIGS. 12-13 housed within a battery case.

FIG. 14 depicts a battery system 900 including a battery 902, a battery case 910 with a battery case cover 912, and a battery management system including the thermal subsystem 800 of FIGS. 12-13 contained within the battery case cover 912. The battery 902 may specifically be a lithium ion battery having one or more Li-ion battery cells. As shown, the battery management system is connected in electrical series with the one or more battery cells of the battery 902. The planar, compact form of the thermal subsystem 800 allows it to fit within the limited space of the battery case cover 912.

Figure 15:
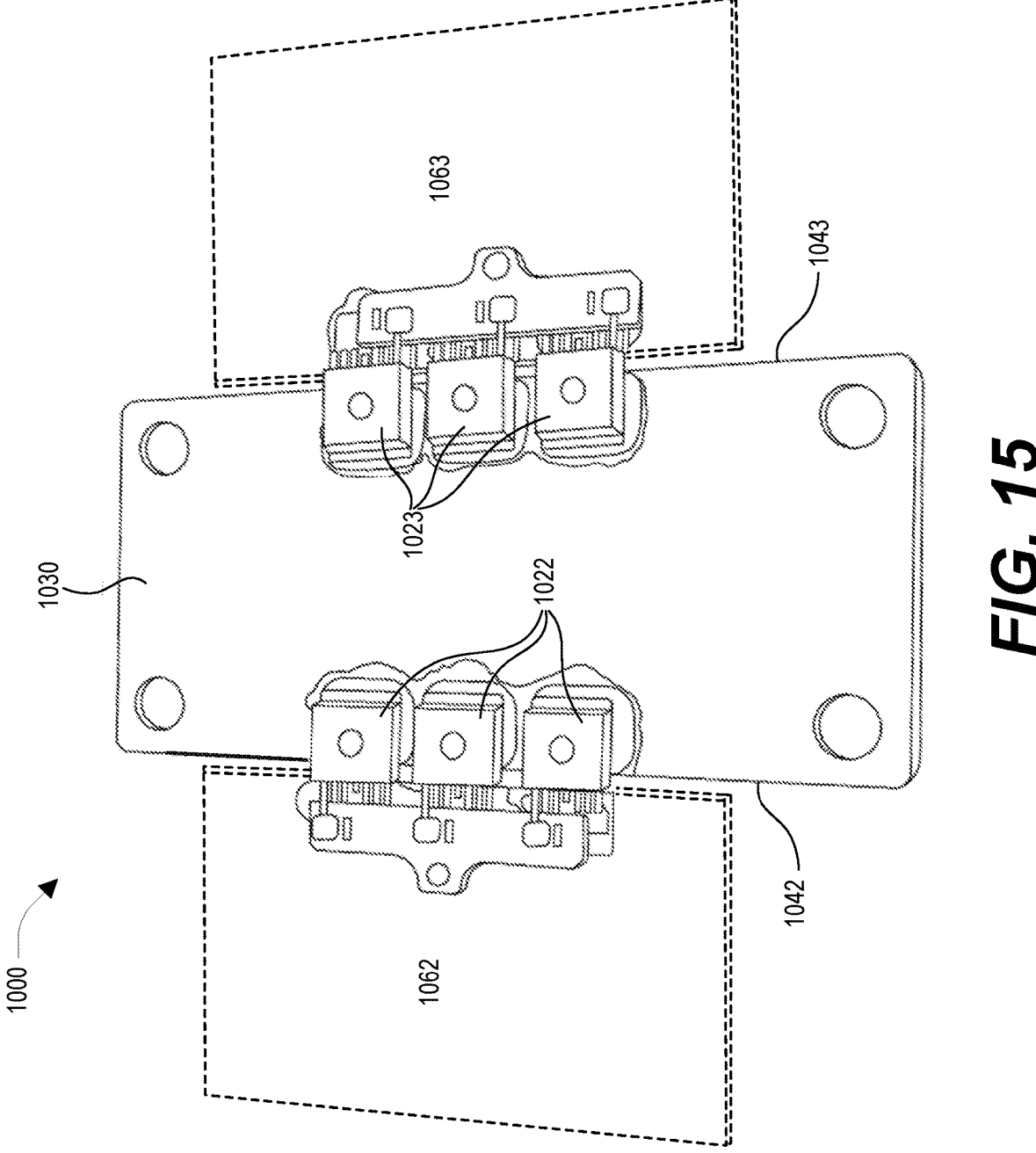
FIG. 15 is a top view of another thermal subsystem of a BMS having a copper plate with two sets of multiple electronic components. The multiple electronic components are configured to connect the copper plate to other modules (represented by dashed lines) of the thermal subsystem, which can include a number of different components, such as additional copper plates, PCBs, or connectors.

FIG. 15 depicts a thermal subsystem 1000 of a battery management system for use in a rechargeable battery. The thermal subsystem 1000 includes a first electrically conductive metal plate 1030 and a first set of multiple electronic components 1022 (e.g. three MOSFETs arranged in parallel) positioned along a first edge 1042 of the first conductive metal plate 1030, wherein the first set of multiple electronic components 1022 are configured to electrically connect the first electrically conductive metal plate to a first module 1062 of the thermal subsystem 1000. The thermal subsystem 1000 also includes a second set of multiple electronic components 1023 (e.g. three MOSFETs arranged in parallel) positioned along a second edge 1043 of the first conductive metal plate 1030, wherein the second set of multiple electronic components 1023 are configured to electrically connect the first electrically conductive metal plate 1030 to a second module 1063 of the thermal subsystem 1000. Although the first and second sets of multiple electronic components 1022, 1023 are depicted to each include MOSFETs, one or both of the sets may alternatively include one or more current sense resistors, one or more transient-voltage-suppression (TVS) diodes, or one or more similar electronic components.

The first and second modules 1062, 1063 are depicted with dashed lines to represent the multiple different BMS components that they could represent. For instance, the first module 1062 may be a second electrically conductive metal plate. The second electrically conductive metal plate may be positioned on a PCB, or may exist in a disconnected form, as the first electrically conductive metal plate 1030 does. Similarly, the second module may be a third electrically conductive metal plate. Alternatively, the first or second modules may be PCBs. The first electrically conductive metal plate, the first module, and the second module may be arranged within substantially the same plane, thereby providing a compact arrangement.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. Other implementations may be within the scope of the following claims.

The invention claimed is:

1. A battery management system (BMS) for use in a rechargeable battery, the BMS comprising:
    a printed circuit board (PCB) having two electrically conductive metal plates, the two electrically conductive metal plates being located adjacent to and spaced apart from each other on the PCB providing an electrically isolating gap between the two electrically conductive metal plates;
    multiple electronic components of the BMS electrically connected between the two electrically conductive metal plates;
    a third electrically conductive metal plate located adjacent to and spaced apart from one of the two electrically conductive metal plates on the PCB providing an electrically isolating gap therebetween; and
    a second set of multiple electronic components electrically connected between the third electrically conductive metal plate and one of the two electrically conductive metal plates.

2. The BMS according to claim 1, wherein the multiple electronic components include multiple MOSFETs.

3. The BMS according to claim 1, wherein the second set of multiple electronic components includes multiple current sense resistors.

4. The BMS according to claim 3, further comprising:
    a fourth electrically conductive metal plate located adjacent to and spaced apart from the third electrically conductive metal plate on the PCB providing an electrically isolating gap therebetween; and
    a third set of multiple electronic components electrically connected between the fourth electrically conductive metal plate and third electrically conductive metal plate.

5. The BMS according to claim 4, wherein the third set of multiple electronic components includes multiple current sense resistors.

6. The BMS according to claim 1, wherein the second set of multiple electronic components includes multiple MOSFETs.

7. The BMS according to claim 1, wherein the BMS comprises a first electrically conductive metal plate, a second electrically conductive metal plate, the third electrically conductive metal plate, and a fourth electrically conductive metal plate.

8. The BMS according to claim 7, further comprising a negative battery terminal connected to the fourth electrically conductive metal plate.

9. The BMS according to claim 1, further comprising a positive battery terminal connected to the PCB.

10. The BMS according to claim 1, wherein the two electrically conductive metal plates are arranged in electrical series.

11. The BMS according to claim 1, wherein the two electrically conductive metal plates are made of copper.

12. The BMS according to claim 1, further comprising multiple conductive metal pads connecting the two electrically conductive metal plates to the PCB.

13. The BMS according to claim 12, wherein the multiple conductive metal pads are formed by etching through a metal layer provided on a substrate of the PCB.

14. The BMS according to claim 12, wherein the multiple conductive metal pads are located on the PCB so that corners of the two electrically conductive metal plates connect with the multiple conductive metal pads to secure the two electrically conductive metal plates to the PCB.

15. The BMS according to claim 12, wherein the two electrically conductive metal plates are soldered to the multiple conductive metal pads of the PCB to secure the two electrically conductive metal plates to the PCB.

16. The BMS according to claim 12, wherein the multiple conductive metal pads are located on the PCB so that edges of the two electrically conductive metal plates connect with the multiple conductive metal pads to secure the two electrically conductive metal plates to the PCB.

17. The BMS according to claim 12, wherein each of the two electrically conductive metal plates is connected to the PCB using only a single conductive metal pad.

18. The BMS according to claim 12, wherein the multiple conductive metal pads are located on the PCB so that the two electrically conductive metal plates are connected by a lower surface underneath the two electrically conductive metal plates to secure the two electrically conductive metal plates to the PCB.

19. The BMS according to claim 12, wherein the multiple conductive metal pads are made of copper.

20. The BMS according to claim 12, wherein the multiple conductive metal pads comprise a single metal layer.

21. The BMS according to claim 12, wherein the multiple conductive metal pads are electrically isolated on the PCB of the BMS and provide only mechanical anchoring of the two electrically conductive metal plates.

22. The BMS according to claim 12, wherein the multiple conductive metal pads connect to multiple other electrical components or electrical circuits of the PCB.

23. The BMS according to claim 1, wherein multiple vias are provided to electrically and thermally connect multiple layers on the PCB.

24. A battery management system (BMS) for use in a rechargeable battery, the BMS comprising:
    a printed circuit board (PCB) having two electrically conductive metal plates, the two electrically conductive metal plates being located adjacent to and spaced apart from each other on the PCB providing an electrically isolating gap between the two electrically conductive metal plates; and
    multiple electronic components of the BMS electrically connected between the two electrically conductive metal plates;
    wherein the BMS comprises a first electrically conductive metal plate, a second electrically conductive metal plate, a third electrically conductive metal plate, and a fourth electrically conductive metal plate,
    wherein multiple MOSFETs are connected between the first electrically conductive metal plate and the second electrically conductive metal plate, wherein multiple MOSFETs are connected between the second electrically conductive metal plate and the third electrically conductive metal plate, and wherein multiple current sense resistors are connected between the third electrically conductive metal plate and the fourth electrically conductive metal plate.

25. The BMS according to claim 24, further comprising a BMS controller electrically connected to the multiple MOSFETs and the multiple current sense resistors.

26. A battery management system (BMS) for use in a rechargeable battery, the BMS comprising:
   a first electrically conductive metal plate;
   a second electrically conductive metal plate, the two electrically conductive metal plates being located adjacent to and spaced apart from each other, thereby providing an electrically isolating gap between the two electrically conductive metal plates;
   multiple electronic components of the BMS electrically connected between the two electrically conductive metal plates;
   a third electrically conductive metal plate located adjacent to and spaced apart from the first electrically conductive metal plate, thereby providing an electrically isolating gap therebetween; and
   a second set of multiple electronic components electrically connected between the third and the first electrically conductive metal plates.

27. The BMS according to claim 26, wherein the multiple electronic components include multiple MOSFETs.

28. The BMS according to claim 26, wherein the second set of multiple electronic components includes multiple current sense resistors.

29. The BMS according to claim 26, further comprising:
   a fourth electrically conductive metal plate located adjacent to and spaced apart from the second electrically conductive metal plate, thereby providing an electrically isolating gap therebetween; and
   a second set of multiple MOSFETs electrically connected between the second and the fourth electrically conductive metal plates.

30. The BMS according to claim 29, further comprising:
   a negative battery terminal connected to the fourth electrically conductive metal plate.

31. The BMS according to claim 26, wherein the two electrically conductive metal plates each have one or more edges accommodating the multiple electronic components, wherein the one or more edges are diagonally oriented with respect to an edge of the BMS.

32. The BMS according to claim 30, further comprising:
   a BMS controller electrically connected to the multiple electronic components.

33. A battery management system (BMS) for use in a rechargeable battery, the BMS comprising:
   a first electrically conductive metal plate;
   a second electrically conductive metal plate, the two electrically conductive metal plates being located adjacent to and spaced apart from each other, thereby providing an electrically isolating gap between the two electrically conductive metal plates;
   multiple electronic components of the BMS electrically connected between the two electrically conductive metal plates; and
   a printed circuit board (PCB) in electrical communication with the first and the second electrically conductive metal plates, wherein the first and the second electrically conductive metal plates are not positioned as a component on the PCB.

34. The BMS according to claim 33, wherein the PCB, the first electrically conductive metal plate, and the second electrically conductive metal plate are arranged within substantially the same plane.

35. The BMS according to claim 33, wherein the PCB is affixed to a surface of at least one of the first and the second electrically conductive metal plates.

36. The BMS according to claim 33, wherein at least one of the first and the second electrically conductive metal plates has one or more apertures configured to align with one or more apertures on the PCB in a manner that the PCB can be affixed to at least one of the first and the second electrically conductive metal plates.

37. The BMS according to claim 33, further comprising:
   one or more wires providing an electrical communication between the PCB and at least one of the first and the second electrically conductive metal plates.

38. A battery management system (BMS) for use in a rechargeable battery, the BMS comprising:
   a first electrically conductive metal plate;
   a first set of multiple electronic components positioned along a first edge of the first conductive metal plate, wherein the first set of multiple electronic components are configured to electrically connect the first electrically conductive metal plate to a first module of the BMS; and
   a second set of multiple electronic components positioned along a second edge of the first conductive metal plate, wherein the second set of multiple electronic components are configured to electrically connect the first electrically conductive metal plate to a second module of the BMS.

39. The BMS according to claim 38, wherein the first set of multiple electronic components includes multiple MOSFETs.

40. The BMS according to claim 38, wherein the second set of multiple electronic components includes multiple MOSFETs.

41. The BMS according to claim 38, wherein the second set of multiple electronic components includes multiple current sense resistors.

42. The BMS according to claim 38, wherein the first module is a second electrically conductive metal plate.

43. The BMS according to claim 42, wherein the second electrically conductive metal plate is positioned on a PCB.

44. The BMS according to claim 42, wherein the second module is a third electrically conductive metal plate.

45. The BMS according to claim 38, wherein the first module is a PCB.

46. The BMS according to claim 38, wherein the first electrically conductive metal plate, the first module, and the second module are arranged within substantially the same plane.

47. A Li-ion battery, comprising:
   a Li-ion battery cell; and
   a battery management system (BMS) connected in electrical series with the Li-ion battery cell, the BMS comprising:
      a first electrically conductive metal plate;
      a first set of multiple electronic components positioned along a first edge of the first conductive metal plate, wherein the first set of multiple electronic components are configured to electrically connect the first electrically conductive metal plate to a first module of the BMS; and a second set of multiple electronic components positioned along a second edge of the first conductive metal plate, wherein the second set of multiple electronic components are configured to electrically connect the first electrically conductive metal plate to a second module of the BMS.

* * * * *